(12) United States Patent
Mittal et al.

(10) Patent No.: US 9,746,889 B2
(45) Date of Patent: Aug. 29, 2017

(54) PACKAGE-ON-PACKAGE (POP) DEVICE COMPRISING BI-DIRECTIONAL THERMAL ELECTRIC COOLER

(71) Applicant: QUALCOMM Incorporated, San Diego, CA (US)

(72) Inventors: Rajat Mittal, San Diego, CA (US);
Hee Jun Park, San Diego, CA (US);
Peng Wang, San Diego, CA (US);
Mehdi Saeidi, San Diego, CA (US);
Arpit Mittal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/709,276

(22) Filed: May 11, 2015

(65) Prior Publication Data
US 2016/0334845 A1  Nov. 17, 2016

(51) Int. Cl.
*H01L 29/15* (2006.01)
*H01L 21/20* (2006.01)
(Continued)

(52) U.S. Cl.
CPC ............ *G06F 1/206* (2013.01); *G01K 7/04* (2013.01); *G05D 23/1906* (2013.01); *H01L 23/34* (2013.01); *H01L 23/38* (2013.01); *H01L 23/49811* (2013.01); *H01L 25/0657* (2013.01); *H01L 25/105* (2013.01); *H01L 23/3677* (2013.01); *H01L 2224/16225* (2013.01); *H01L 2224/32145* (2013.01);
(Continued)

(58) Field of Classification Search
USPC ........ 257/738, 666, 706, 433, 421, 676, 415, 257/751, 432, 467, 503, 737, 98, 191; 438/382, 106, 109, 140, 123, 108, 22, 34, 438/492, 47, 196
See application file for complete search history.

(56) References Cited

U.S. PATENT DOCUMENTS 7,034,394 B2  4/2006  Ramanathan et al.
7,301,233 B2  11/2007  Lee et al.
(Continued)

OTHER PUBLICATIONS

International Search Report and Written Opinion—PCT/US2016/031671—ISA/EPO—Aug. 18, 2016.

*Primary Examiner* — Julio J Maldonado
*Assistant Examiner* — Moin Rahman
(74) *Attorney, Agent, or Firm* — Loza & Loza, LLP/Qualcomm

(57) ABSTRACT

A package-on-package (PoP) device includes a first package, a second package, and a bi-directional thermal electric cooler (TEC). The first package includes a first substrate and a first die coupled to the first substrate. The second package is coupled to the first package. The second package includes a second substrate and a second die coupled to the second substrate. The TEC is located between the first die and the second substrate. The TEC is adapted to dynamically dissipate heat back and forth between the first package and the second package. The TEC is adapted to dissipate heat from the first die to the second die in a first time period. The TEC is further adapted to dissipate heat from the second die to the first die in a second time period. The TEC is adapted to dissipate heat from the first die to the second die through the second substrate.

34 Claims, 20 Drawing Sheets

(51) Int. Cl.
  *G06F 1/20* (2006.01)
  *H01L 23/34* (2006.01)
  *H01L 23/38* (2006.01)
  *H01L 25/065* (2006.01)
  *H01L 25/10* (2006.01)
  *G01K 7/04* (2006.01)
  *G05D 23/19* (2006.01)
  *H01L 23/498* (2006.01)
  *H01L 23/367* (2006.01)

(52) U.S. Cl.
  CPC ............... *H01L 2224/48091* (2013.01); *H01L 2224/48227* (2013.01); *H01L 2224/73253* (2013.01); *H01L 2224/73265* (2013.01); *H01L 2225/1094* (2013.01); *H01L 2924/15174* (2013.01); *H01L 2924/15311* (2013.01); *H01L 2924/181* (2013.01)

(56) References Cited

U.S. PATENT DOCUMENTS

| | | |
|---|---|---|
| 8,704,363 B2 | 4/2014 | Felk et al. |
| 2004/0099945 A1 | 5/2004 | Ku |
| 2009/0071525 A1 | 3/2009 | Hodes et al. |
| 2009/0321909 A1* | 12/2009 | Gu .................... H01L 23/38 257/686 |
| 2010/0224985 A1* | 9/2010 | Michael ............. H01L 23/3114 257/692 |
| 2012/0153454 A1 | 6/2012 | Liu et al. |
| 2013/0139524 A1* | 6/2013 | Kim ........................ F25B 21/02 62/3.7 |
| 2013/0301218 A1* | 11/2013 | Li ............................ F04D 33/00 361/695 |

\* cited by examiner

PROFILE VIEW

ANGLED VIEW

ARRAY OF THERMAL ELECTRICAL COOLERS

ANGLED VIEW

ARRAY OF THERMAL ELECTRICAL COOLERS

= HEAT TRANSFER FROM A (E.G., BOTTOM) TO B (E.G., TOP)

= HEAT TRANSFER FROM B (E.G., TOP) TO A (E.G., BOTTOM)

= INACTIVE (OFF) – PASSIVE HEAT CONDUCTION FROM HOTTER SIDE TO COOLER SIDE

US 9,746,889 B2

PACKAGE-ON-PACKAGE (POP) DEVICE COMPRISING BI-DIRECTIONAL THERMAL ELECTRIC COOLER

BACKGROUND

Field

Various features relate to a package-on-package (PoP) device that includes a bi-directional thermal electric cooler (TEC).

Background

FIG. 1 illustrates an integrated device package 100 that includes a first die 102 and a package substrate 106. The package substrate 106 includes a dielectric layer and a plurality of interconnects 110. The package substrate 106 is a laminated substrate. The plurality of interconnects 110 includes traces, pads and/or vias. The first die 102 is coupled to the package substrate 106 through the first set of solder balls 112. The package substrate 106 is coupled to the PCB 108 through the second set of solder balls 116. FIG. 1 also illustrates a heat spreader 120 coupled to the die 102. An adhesive or thermal interface material may be used to couple the heat spreader 120 to the die 102. As shown in FIG. 1, the heat spreader 120 is adapted to dissipate heat away from the die 102 to an external environment. It is noted that heat may dissipate away from the die in various directions.

One drawback of the above configuration is that the heat spreader 120 is a passive heat dissipating device. Thus, there is no active control of how heat is dissipated. That is, the use of heat spreader 120 does not allow for a dynamic heat flow control. Second, the use of the heat spreader 120 is only applicable when a single die is used in the integrated device package. Today's mobile devices and/or wearable devices include many dies, and thus are more complicated configurations that require more intelligent thermal and/or heat dissipation management. Putting a heat spreader in a device that includes several dies will not provide effective thermal and/or heat dissipation management of the device.

Therefore, there is a need for an device that includes several dies and an effective thermal management of the device, while at the same time meeting the needs and/or requirements of mobile computing devices and/or wearable computing devices.

SUMMARY

Various features relate to a package-on-package (PoP) device that includes a bi-directional thermal electric cooler (TEC).

A first example provides a package on package (PoP) device that includes a first package and a second package coupled to the first package. The first package includes a first substrate, and a first die coupled to the first substrate. The second package includes a second substrate, and a second die coupled to the second substrate. The package on package (PoP) device also includes a bi-directional thermal electric cooler (TEC) located between the first die and the second substrate, where the bi-directional TEC is adapted to dynamically dissipate heat back and forth between the first package and the second package.

A second example provides a package on package (PoP) device that includes a first package and a second package coupled to the first package. The first package includes a first substrate, and a first die coupled to the first substrate. The second package includes a second substrate, and a second die coupled to the second substrate. The package on package (PoP) device also includes a bi-directional heat transfer means located between the first die and the second substrate, where the bi-directional heat transfer means is configured to dynamically dissipate heat back and forth between the first package and the second package.

A third example provides a method for thermal management of a package on package (POP) device. The method receives a first temperature reading of a first die. The method receives a second temperature reading of a second die. The method determines whether the first temperature reading of the first die is equal or greater than a first maximum temperature of the first die. The method determines whether the second temperature reading of the second die is equal or greater than a second maximum temperature of the second die. The method configures a bi-directional thermal electric cooler (TEC) to dissipate heat from the first die to the second die when (i) the first temperature reading is equal or greater than the first maximum temperature, and (ii) the second temperature reading is less than the second maximum temperature. The method configures the bi-directional thermal electric cooler (TEC) to dissipate heat from the second die to the first die when (i) the second temperature reading is equal or greater than the second maximum temperature, and (ii) the first temperature reading is less than the first maximum temperature.

A fourth example provides a processor readable storage medium comprising one or more instructions for performing thermal management of a package on package (POP) device, which when executed by at least one processing circuit, causes the at least one processing circuit to determine whether the first temperature reading of the first die is equal or greater than a first maximum temperature of the first die; determine whether the second temperature reading of the second die is equal or greater than a second maximum temperature of the second die; configure a bi-directional thermal electric cooler (TEC) to dissipate heat from the first die to the second die when (i) the first temperature reading is equal or greater than the first maximum temperature, and (ii) the second temperature reading is less than the second maximum temperature; and configure the bi-directional thermal electric cooler (TEC) to dissipate heat from the second die to the first die when (i) the second temperature reading is equal or greater than the second maximum temperature, and (ii) the first temperature reading is less than the first maximum temperature.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package on package (PoP) device that includes a first package, a second package, and a bi-directional thermal electric cooler (TEC). The first package includes a first substrate and a first die coupled to the first substrate. The second package is coupled to the first package. The second package includes a second substrate and a second die coupled to the second substrate. The bi-directional TEC is located between the first die and the second substrate. The bi-directional TEC is adapted to dynamically dissipate heat back and forth between the first package and the second package. The bi-directional TEC is adapted to dissipate heat from the first die to the second die in a first time period. The bi-directional TEC is further adapted to dissipate heat from the second die to the first die in a second time period. The bi-directional TEC is adapted to dissipate heat from the first die to the second die through the second substrate.

Figure 1:
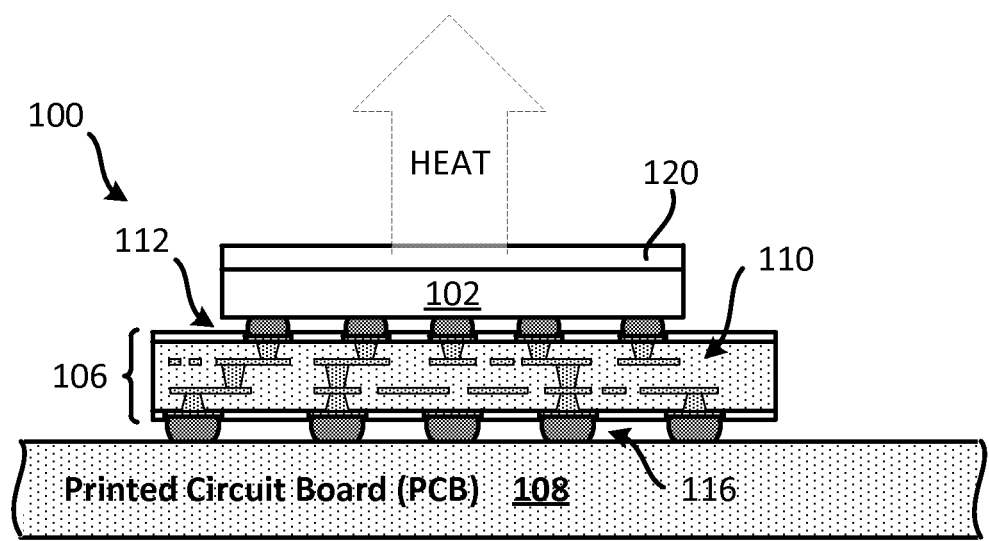
FIG. 1 illustrates an integrated device package.
Figure 2:
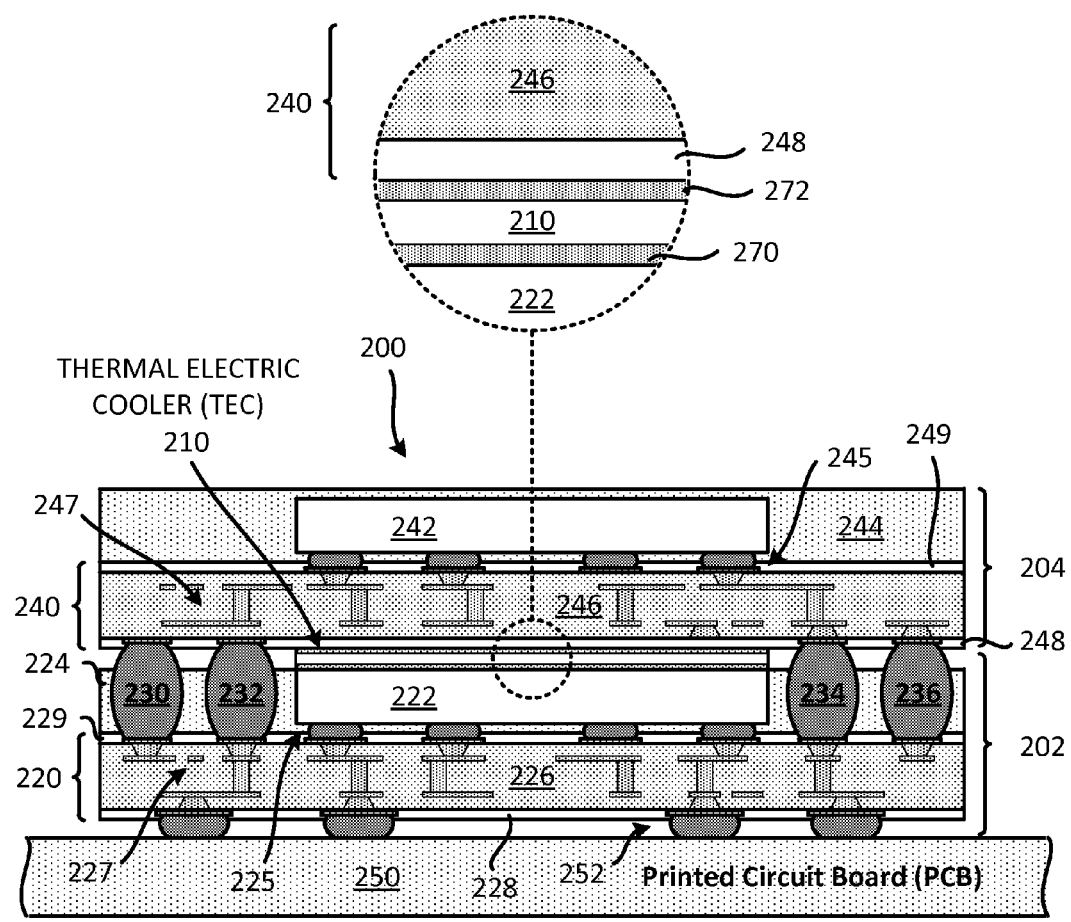
FIG. 2 illustrates a profile view of an example of a package-on-package (PoP) device that includes a bi-directional thermal electric cooler (TEC).

Exemplary Package on Package (PoP) Device Comprising Bi-Directional Thermal Electric Cooler FIG. 2 illustrates an example of a package on package (PoP) device 200 that includes a first package 202 (e.g., first integrated device package), a second package 204 (e.g., second integrated device package), and a thermal electric cooler (TEC) 210.

The first package 202 includes a first substrate 220, a first die 222, and a first encapsulation layer 224. The first package 202 may also include the TEC 210. The TEC 210 is coupled to the first die 222. An adhesive 270 (e.g., thermally conductive adhesive) may be used to couple the TEC 210 to the first die 222. The adhesive 270 may couple a first surface (e.g., bottom surface) of the TEC 210 to a back side of the first die 222. The TEC 210 may be a bi-directional TEC capable of dissipating heat in a first direction (e.g., in a first time period/frame) and a second direction (e.g., in a second time period/frame), where the second direction is opposite to the first direction. More specifically, the TEC 210 may be a bi-directional TEC that may be configured and/or adapted to dynamically (e.g., in real time during operation of the PoP device 200) dissipate heat back and forth between the first package 202 and the second package 204. The TEC 210 may be a bi-directional heat transfer means. The TEC 210 may provide active heat dissipation (e.g., active heat transfer means). Various examples of TECs are further illustrated and described in detail below in at least FIGS. 6-9.

The first substrate 220 may be a package substrate. The first substrate 220 includes at least one dielectric layer 226, several interconnects 227, a first solder resist layer 228, and a second solder resist layer 229. The first solder resist layer 228 is on a first surface (e.g., bottom surface) of the first substrate 220. The second solder resist layer 229 is on a second surface (e.g., top surface) of the first substrate 220. The dielectric layer 226 may include a core layer and/or a prepeg layer. The interconnects 227 may include several traces, vias, and/or pads. The interconnects 227 may be located in the dielectric layer 226 and/or on a surface of the dielectric layer 226.

An interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that is capable of providing an electrical path for a signal (e.g., data signal, ground signal, power signal). An interconnect may include more than one element/component. A set of interconnects may include one or more interconnects.

The first die 222 is coupled to (e.g., mounted) the first substrate 220 through a set of solder 225 (e.g., solder balls). The first die 222 may be a logic die (e.g., central processing unit (CPU), graphical processing unit (GPU)). The first die 222 may be a flip chip. The first die 222 may be coupled to the first substrate 220 differently in different implementations. For example, the first die 222 may be coupled to the first substrate 220 through pillars and/or solder. Other forms of interconnects may be used to couple the first die 222 to the first substrate 220.

The first encapsulation layer 224 encapsulates at least part of the first die 222. The first encapsulation layer 224 may include a mold and/or an epoxy fill. The first encapsulation layer 224 may include several solder 230, 232, 234, and 236 (e.g., solder balls). The solder 230, 232, 234, and 236 may be coupled to the interconnects 227.

The first package 202 is coupled to (e.g., mounted on) a printed circuit board (PCB) 250 through a set of solder balls 252. The set of solder balls 252 is coupled to the interconnects 227. However, it is noted that the first package 202 may be coupled to the PCB 250 by using other means, such as a land grid array (LGA) and/or a pin grid array (PGA).

The second package 204 includes a second substrate 240, a second die 242, and a second encapsulation layer 244. The second substrate 240 may be a package substrate. The second substrate 240 includes at least one dielectric layer 246, several interconnects 247, a first solder resist layer 248, and a second solder resist layer 249. The first solder resist layer 248 is on a first surface (e.g., bottom surface) of the second substrate 240. The second solder resist layer 249 is on a second surface (e.g., top surface) of the second substrate 240. The dielectric layer 246 may include a core layer and/or a prepeg layer. The interconnects 247 may include several traces, vias, and/or pads. The interconnects 247 may be located in the dielectric layer 246 and/or on a surface of the dielectric layer 246.

The second die 242 is coupled to (e.g., mounted) the second substrate 240 through a set of solder balls 245. The second die 242 may be a logic die or a memory die. The second die 242 may be a flip chip. The second die 242 may be coupled to the second substrate 240 differently in different implementations. For example, the second die 242 may be coupled to the second substrate 240 through pillars and/or solder. Other forms of interconnects may be used to couple the second die 242 to the second substrate 240. The second encapsulation layer 244 encapsulates at least part of the second die 242. The second encapsulation layer 244 may include a mold and/or an epoxy fill.

The second package 204 is coupled (e.g., mounted) to the first package 202 such that the TEC 210 is between the first package 202 and the second package 204. As shown in FIG. 2, the TEC 210 is located between the first die 222 and the second substrate 240. An adhesive 272 (e.g., thermally conductive adhesive) may be used to couple the TEC 210 to the second substrate 240. The adhesive 272 may couple a second surface (e.g., top surface) of the TEC 210 to the first solder resist layer 248. In some implementations, the adhesive 272 may couple the second surface of the TEC 210 to the dielectric layer 246. The second package 204 may be coupled to the first package 202 so that at least part of the second die 242 is vertically aligned with the TEC 210 and/or the first die 222. The second package 204 may be electrically coupled to the first package 202 through the solder 230, 232, 234 and 236. The solder 230, 232, 234, and 236 may be coupled to the interconnects 247.

As mentioned above, the TEC 210 may be a bi-directional TEC capable of dissipating heat in a first direction (e.g., in a first time period/frame) and a second direction (e.g., in a second time period/frame), where the second direction is opposite to the first direction.

Figure 3:
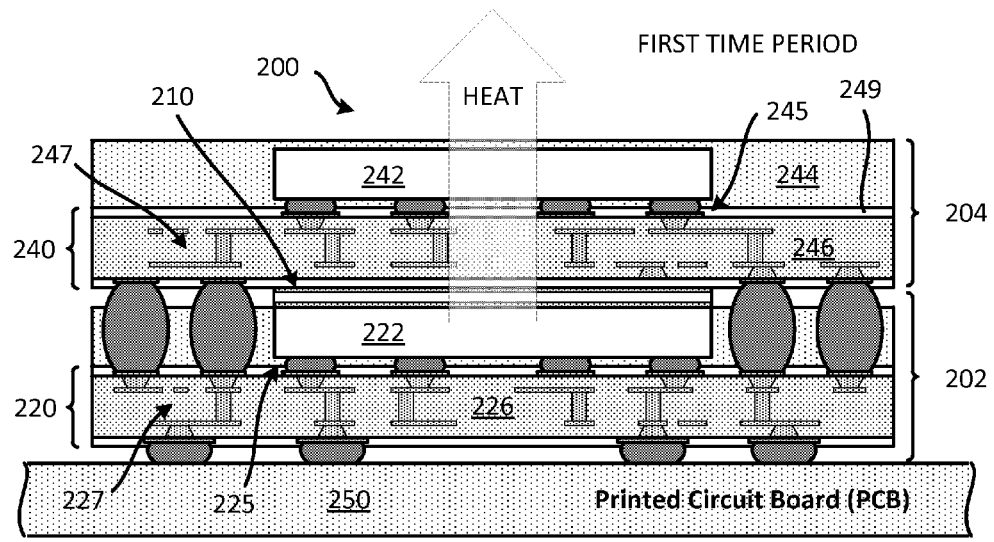
FIG. 3 illustrates an example of a heat transfer flow in a package-on-package (PoP) device that includes a bi-directional thermal electric cooler (TEC).
Figure 4:
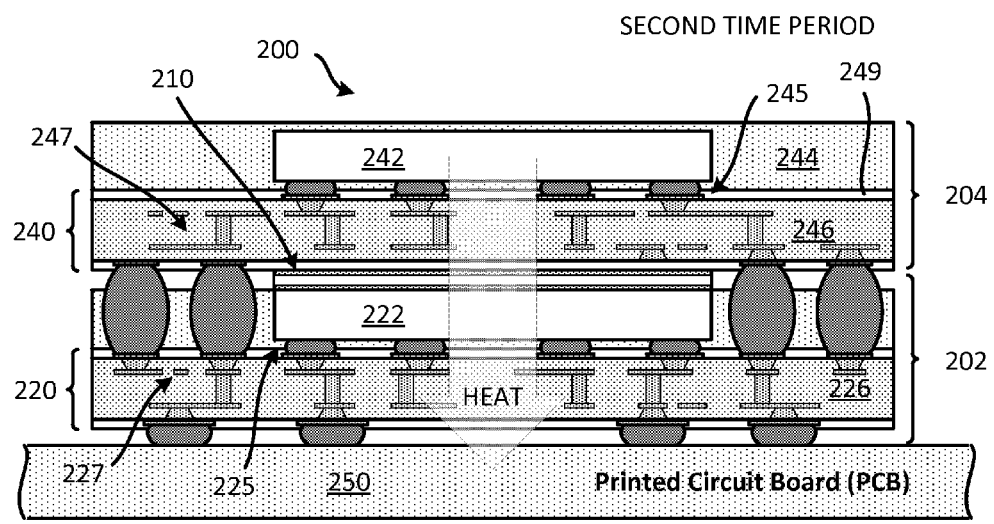
FIG. 4 illustrates an example of a heat transfer flow in a package-on-package (PoP) device that includes a bi-directional thermal electric cooler (TEC).

FIGS. 3-4 illustrate examples of how the TEC 210 may be adapted and/or configured to dissipate heat. FIG. 3 illustrates the TEC 210 adapted to dissipate heat from the first package 202 to the second package 204 during a first time period. At or during the first time period, the TEC 210 is adapted to dissipate heat from the first die 222 to the second package 204. The heat that is dissipated from the first die 222 may pass through the TEC 210, the second substrate 240 (which includes the dielectric layer 246, the interconnects 247), the solder balls 245, the second die 242, and/or the second encapsulation layer 244. Thus, some of the heat from the first die 222 may heat the second die 242.

FIG. 4 illustrates the TEC 210 adapted to dissipate heat from the second package 204 to the first package 202 during a second time period. At or during the second time period, the TEC 210 is adapted to dissipate heat from the second die 242 to the first package 202. The heat that is dissipated from the second die 242 may pass through the solder balls 245, the second substrate 240 (which includes the dielectric layer 246, the interconnects 247), the TEC 210 and/or the first die 222. Thus, some of the heat from the second die 242 may heat the first die 222.

In some implementations, the TEC 210 may be adapted to dissipate heat back and forth between the first package 202 and the second package 204 (e.g., back and forth between the first die 222 and the second die 242) to provide optimal die performance while still operating within thermal limits of the dies. For example, if the first die 222 has reached its thermal operating limit (e.g., temperature operating limit), the TEC 210 may be adapted and/or configured to dissipate heat away from the first die 222 and towards the second die 242 (as long as the second die has not reached its thermal operating limit). Similarly, if the first die 222 is still within its thermal operating limit, but the second die 242 has reached its thermal operating limit, the TEC 210 may be adapted and/or configured to dissipate heat away from the second die 242 and towards the first die 222. Thus, the TEC 210 may be a bi-directional TEC that may be configured and/or adapted to dynamically (e.g., in real time during operation of the PoP device 200) dissipate heat back and forth between the first package 202 and the second package 204. Various examples of TECs in a device (e.g., PoP device) and how the TECs may be configured, adapted, and/or controlled for thermal management are further illustrated and described in detail below in at least FIGS. 6-12 and 16-18.

In some implementations, a TEC (e.g., bi-directional TEC) may be located between two dies. An example of such a configuration is illustrated and described below in FIG. 21.

Figure 5:
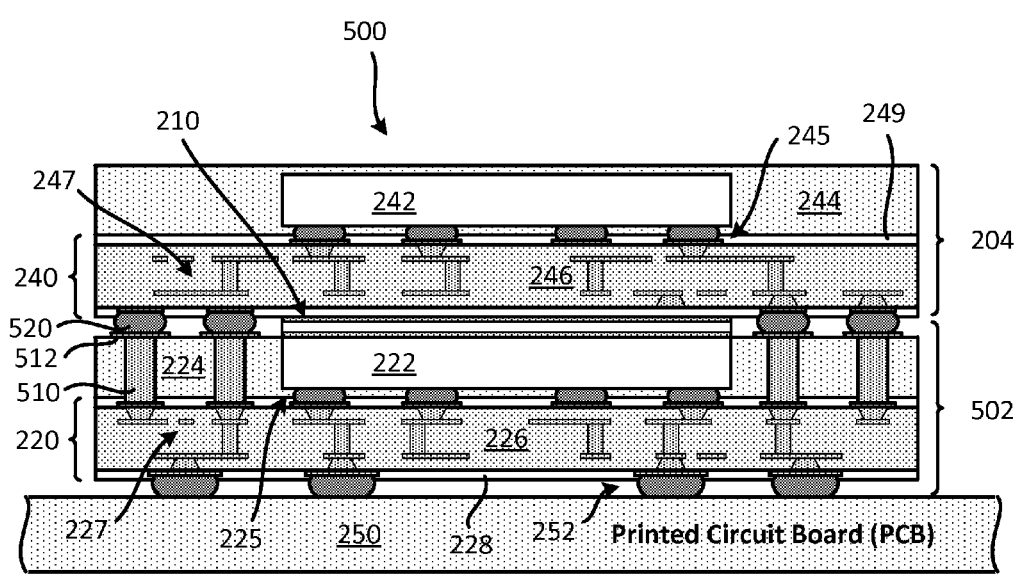
FIG. 5 illustrates a profile view of another example of a package-on-package (PoP) device that includes a bi-directional thermal electric cooler (TEC).

Exemplary Package on Package (PoP) Device Comprising Bi-Directional Thermal Electric Cooler FIG. 5 illustrates an example of another package on package (PoP) device 500 that includes a first package 502 (e.g., first integrated device package), the second package 204 (e.g., second integrated device package), and the thermal electric cooler (TEC) 210. In some implementations, the PoP device 500 of FIG. 5 is similar to the PoP device 200, except that different types of interconnects are used to electrically couple the second package 204 to the first package 502.

The first package 502 includes the first substrate 220, the first die 222, and the first encapsulation layer 224. The first package 502 may also include the TEC 210. The TEC 210 is coupled to the first die 222. The adhesive 270 (e.g., thermally conductive adhesive) may be used to couple the TEC 210 to the first die 222. The adhesive 270 may couple a first surface (e.g., bottom surface) of the TEC 210 to the back side of the first die 222. The TEC 210 may be a bi-directional TEC capable of dissipating heat in a first direction (e.g., in a first time period/frame) and a second direction (e.g., in a second time period/frame), where the second direction is opposite to the first direction. In some implementations, the TEC 210 may be a bi-directional TEC that may be configured and/or adapted to dynamically (e.g., in real time during operation of the PoP device 200) dissipate heat back and forth between the first package 502 and the second package 204, as described above for FIGS. 3-4.

The first encapsulation layer 224 encapsulates at least part of the first die 222. The first encapsulation layer 224 may include a mold and/or an epoxy fill. The first encapsulation layer 224 may include several vias 510. The vias 510 may be through encapsulation vias (TEVs) or through mold vias (TMVs). The vias 510 are coupled to the interconnects 227. Several interconnects 512 are formed in the first encapsulation layer 224. The interconnects 512 may be redistribution interconnects. The interconnects 512 are coupled to the vias 510. A solder 520 (e.g., solder ball) is coupled to the interconnects 512 and the second substrate 240. The solder 520 is coupled to the interconnects 247 of the second substrate 240.

Exemplary Thermal Electric Cooler (TEC)

Figure 6:
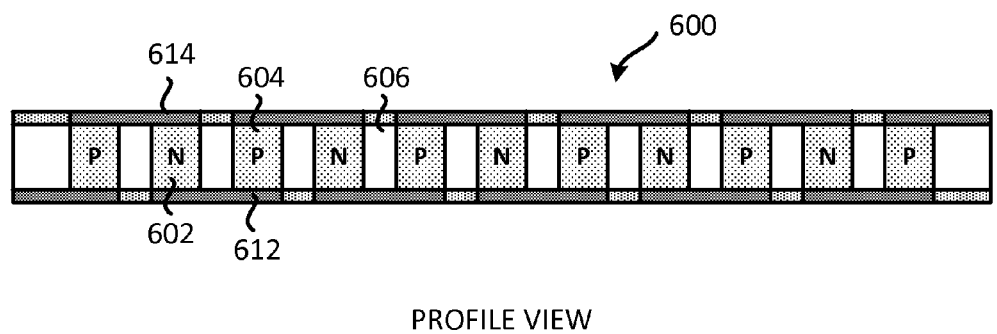
FIG. 6 illustrates a profile view of a bi-directional thermal electric cooler.

FIG. 6 illustrates a profile view of an example of thermal electric cooler (TEC) 600. The TEC 600 may be implemented in any packages and/or package on package (PoP) devices described in the present disclosure. For example, the TEC 600 may be the TEC 210 described above.

The TEC 600 may be a bi-directional TEC. The TEC 600 may be a bi-directional heat transfer means. The TEC 600 includes an N-doped component 602 (e.g., N-doped semiconductor) and a P-doped component 604 (e.g., P-doped semiconductor), a carrier 606, an interconnect 612, and an interconnect 614. The carrier 606 may be optional. The TEC 600 may include several N-doped components 602 and several P-doped components 604. The TEC 600 may include several interconnects 612 and several interconnects 614. The interconnects 612 are located on a first side (e.g., bottom side) of the TEC 600. The interconnects 614 are located on a second side (e.g., top side) of the TEC 600.

The N-doped component 602 is coupled to the P-doped component 604 through an interconnect. For example, the interconnect 614 is coupled to the N-doped component 602. The N-doped component 602 is coupled to the interconnect 612. The interconnect 612 is coupled to the P-doped component 604. The P-doped component 604 is coupled to another interconnect 614. The above pattern may be repeated several times to form the TEC 600.

In some implementations, the TEC 600 may be configured and/or adapted to dissipate heat in a first direction and a second direction by providing a current through the TEC 600. Different polarities of the current that run through the TEC 600 may configure and/or adapt the TEC 600 differently. For example, a first current (e.g., first current with a first polarity) that flows from the interconnect 614, the N-doped component 602, the interconnect 612, and the P-doped component 604 may configure the TEC 600 so that heat dissipates from the bottom side of the TEC 600 to the top side of the TEC 600. In such an instance, the bottom side of the TEC 600 is the cool side, and the top side of the TEC 600 is the hot side.

When a second current (e.g., first current with a second polarity) flows from the P-doped component 604, the interconnect 612, the N-doped component 602, and the interconnect 614, the TEC 600 may be configured so that heat dissipates from the top side of the TEC 600 to the bottom side of the TEC 600. In such instance, the top side of the TEC 600 is the cool side, and the bottom side of the TEC 600 is the hot side.

Thus, by changing the flow or polarity of the current (e.g., positive current, negative current) through the TEC 600, the TEC 600 may be configured as a bi-directional TEC that can be adapted to dissipate heat back and forth between the top side and the bottom side of the TEC 600.

Figure 7:
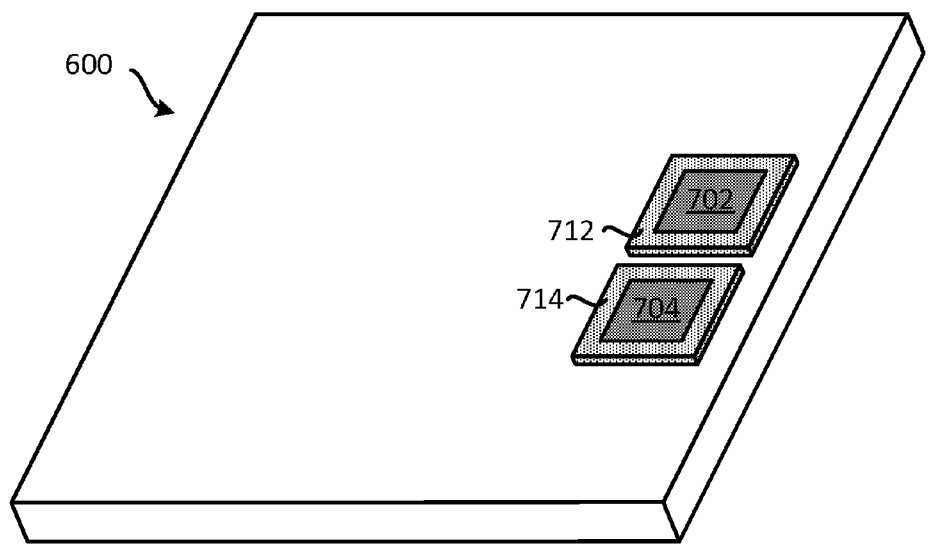
FIG. 7 illustrates an angled view of a bi-directional thermal electric cooler.

FIG. 7 illustrates an angled view of a conceptual TEC 600. The TEC 600 includes a first pad 702 (e.g., first terminal), a second pad 704 (e.g., second terminal), a dielectric layer 712, and a dielectric layer 714. The first pad 702 may be coupled to an interconnect (e.g., interconnect 614) or N-doped component (e.g., N-doped component 602). The second pad 704 may be coupled to an interconnect or P-doped component (e.g., P-doped component 604). The dielectric layers 712 and 714 surround the respective pads 702 and 704 to ensure that there is no shorting when the pads 702 and 704 are coupled to interconnects (e.g., solder) of a package.

The first pad 702 and the second pad 704 may be located on different portions of the TEC 600. FIG. 7 illustrates that the first pad 702 and the second pad 704 are a first side (e.g., top side) of the TEC 600. However, in some implementations, the first pad 702 and/or the second pad 704 may be located on a second side (e.g., bottom side) of the TEC 600. The TEC 600 may be coupled to packages (e.g., die of a package, substrate of a package) by using one or more adhesives (e.g., thermally conductive adhesives). For example, a first adhesive may be coupled on a first side or a first surface of the TEC 600, and a second adhesive may be coupled on a second side or second surface of the TEC 600.

In some implementations, a TEC may include several TECs. That is, a TEC may be an array of TECs that can be individually adapted and/or configured to dissipate heat in a particular direction.

Figure 8:
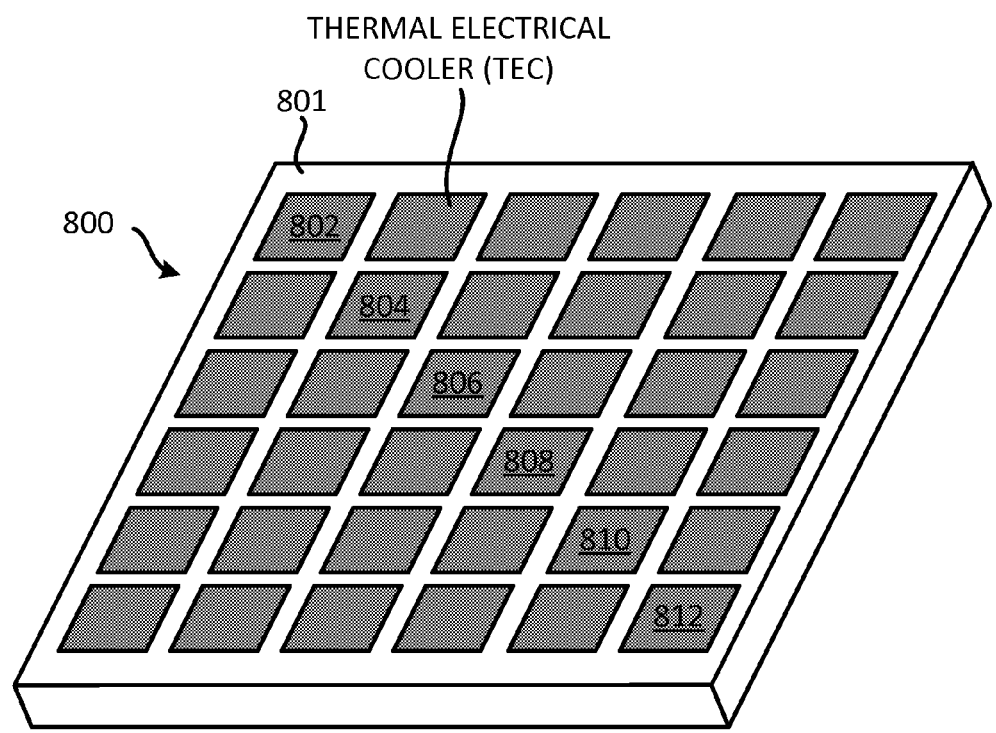
FIG. 8 illustrates an angled view of an assembly bi-directional thermal electric coolers (TECs).

FIG. 8 illustrates an angled view of a conceptual TEC 800 that includes several TECs. The TEC 800 is an array of TECs. As shown in FIG. 8, the TEC 800 includes a carrier 801, a first TEC 802, a second TEC 804, a third TEC 806, a fourth TEC 808, a fifth TEC 810, and a sixth TEC 812. The carrier 801 may be used to provide structural support for the individual TECs. The individual TECs (e.g., TEC 802) may be similar to the TEC 600. The TEC 800 may be implemented in any of the packages and/or PoP devices described in the present disclosure.

The TEC 800 may be used to provide heat dissipation for one or more dies, and/or providing localized heat dissipation for a die. For example, a die may include hot spots and/or cool spots, and the TEC 800 may be used to only dissipate heat away from specific hot spot regions on the die.

Figure 9:
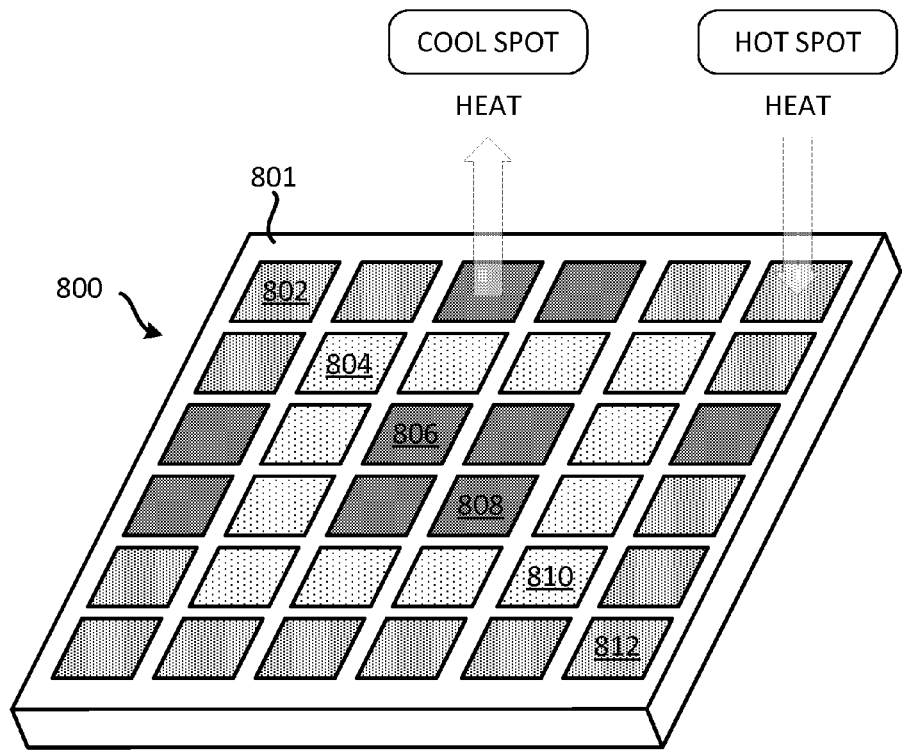
FIG. 9 illustrates an example of how a thermal electric cooler comprising several bi-directional thermal electric coolers (TECs) may be configured.
Figure 9:
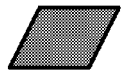
Figure 9:
Figure 9:
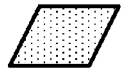

FIG. 9 illustrates an example of how an array of TECs may be configured and/or adapted to dissipate heat. As shown in FIG. 9, the TEC 800 is configured so that some TECs dissipate heat in one direction, while other TECs dissipate heat in another direction. In addition, some TECs may be inactive. When a TEC is inactive, the TEC may still passively conduct (e.g., passive heat conduction) heat from a hotter side to a cooler side. In the example of FIG. 9, the TEC 802 and the TEC 812 are configured and/or adapted to dissipate heat from a top side to a bottom side of the TEC 800. The TEC 806 and the TEC 808 are configured and/or adapted to dissipate heat from a bottom side to a top side of the TEC 800. The TEC 804 and the TEC 810 are inactive (off). The TEC 800 may be dynamically configured and/or adapted differently based on the temperatures (e.g., localized temperatures) of the die(s), as the die(s) are in operation. The TEC 800 may be coupled to one die or several dies.

Exemplary Configurations of Device Comprising Thermal Electric Cooler(s)

Figure 10:
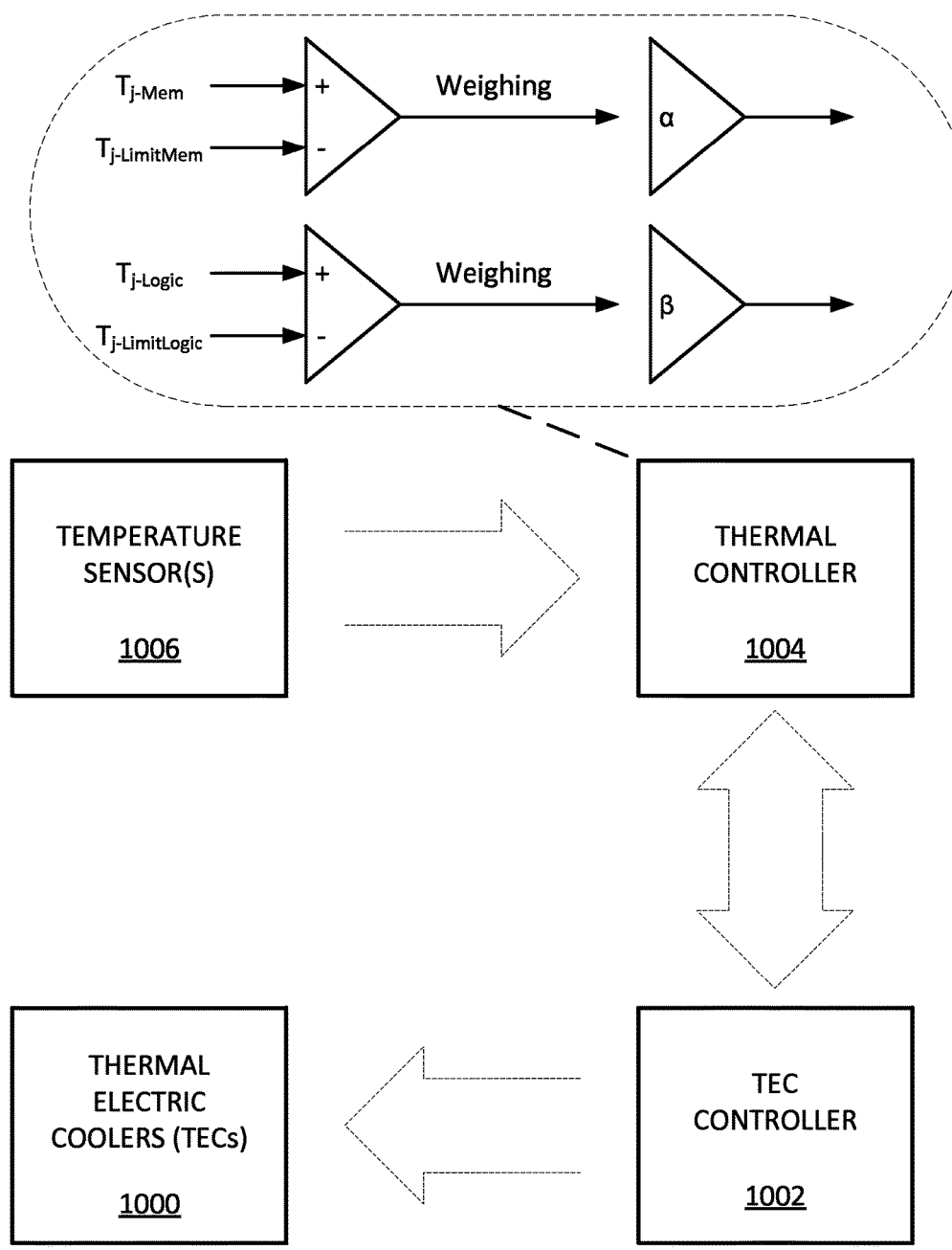
FIG. 10 illustrates a configuration of how a bi-directional thermal electric cooler (TEC) may be controlled by a thermal controller.

A thermal electric cooler (TEC) may be adapted and/or configured by one or more controllers in a device. FIG. 10 illustrates an example of a configuration of how one or more thermal electric coolers (TECs) 1000 may be controlled, configured and/or adapted to dissipate heat. The configuration includes the TECs 1000, a TEC controller 1002, a thermal controller 1004, and several temperature sensors 1006. The TECs 1000 may be a bi-directional heat transfer means.

The temperature sensors 1006 may include at least one temperature sensor for a first die (e.g., logic die), and at least one temperature sensor for a second die (e.g., memory die). The temperature sensors 1006 may include other sensors for other dies. The temperature sensors 1006 may be separate from their respective dies, or they may be integrated into their respective dies. The temperature sensors 1006 are in communication with the thermal controller 1004. The temperature sensors 1006 may transmit temperature readings to the thermal controller 1004. Thus, the thermal controller 1004 may receive temperature readings from the temperature sensors 1006.

The thermal controller 1004 may be a separate device, unit, and/or die. The thermal controller 1004 may be configured to control and regulate operations of a TEC and/or dies so that the dies operate within their operational temperature limits. For example, the thermal controller 1004 may operate how and when an TEC is active (on) or inactive (off). The thermal controller 1004 may also control the performance of a die, by putting performance limitations on the die. For example, the thermal controller 1004 may limit the clock speed of a die in order to ensure that the die does not reach or exceed its maximum operating temperature. The thermal controller 1004 may control, configure, and/or adapt the TECs 1000 through the TEC controller 1002. However, the thermal controller 1004 may control, configure and/or adapt the TECs 1000 directly in some implementations. In some implementations, the TEC controller 1002 is part of the thermal controller 1004. The thermal controller 1004 may transmit signals and/or instruction to the TEC controller 1002 so that the TEC controller 1002 can control, adapt and/or configure the TECs 1000.

The TEC controller 1002 may control, adapt and/or configured one or more TECs 1000 by transmitting one or more currents (e.g., first current, second current) to one or more TECs 1000. The property of the current (e.g., polarity of the current) that is transmitted to the TEC may configure how the TEC dissipates heat. For example, a first current having a first polarity (e.g., positive current) that is transmitted to a TEC may configure the TEC to dissipate heat in a first direction (e.g., bottom to top). A second current having a second polarity (e.g., negative current) that is transmitted to a TEC may configure the TEC to dissipate heat in a second direction (e.g., top to bottom), that is opposite to the first direction. Moreover, different amperes of current may transmitted to the different TECs 1000. For example, first TEC may be transmitted with a first current comprising a first ampere, while a second TEC may be transmitted with a second current comprising a second ampere.

FIG. 10 further illustrates some of the variables that the thermal controller 1004 may take into account to control, adapt and/or configured one or more TECs 1000. As shown in FIG. 10, the thermal controller 1004 may receive an input of a temperature of a first die (e.g., logic die) and compare it to the limit temperature (e.g., upper limit temperature) of the first die. The thermal controller 1004 may further weight the difference (if any) between the temperature of the first die and the limit temperature of the first die to control, adapt and/or configured one or more TECs 1000 associated with (e.g., coupled to) the first die.

FIG. 10 also illustrates the thermal controller 1004 may receive an input of a temperature of a second die (e.g., memory die) and compare it to the limit temperature (e.g., upper limit temperature) of the second die. The thermal controller 1004 may further weight the difference (if any) between the temperature of the second die and the limit temperature of the second die to control, adapt and/or configured one or more TECs 1000 associated with (e.g., coupled to) the first die.

In addition to temperature and/or temperature limits, other variables include the rate at which heat is being generated by the dies, the rate at which the temperature is increasing/decreasing in the dies, the source of the power to the packages (e.g., battery, plug-in source) and/or how much are the dies being utilized (e.g., percentage utilization of dies, clock speed). These variables may be weighed differently.

The thermal controller 1004 may take into account the above various variables separately, independently, concurrently, and/or jointly. An example of how a thermal controller 1004 may take into account the various temperatures of the dies is illustrated and described in FIGS. 16-18.

Figure 11:
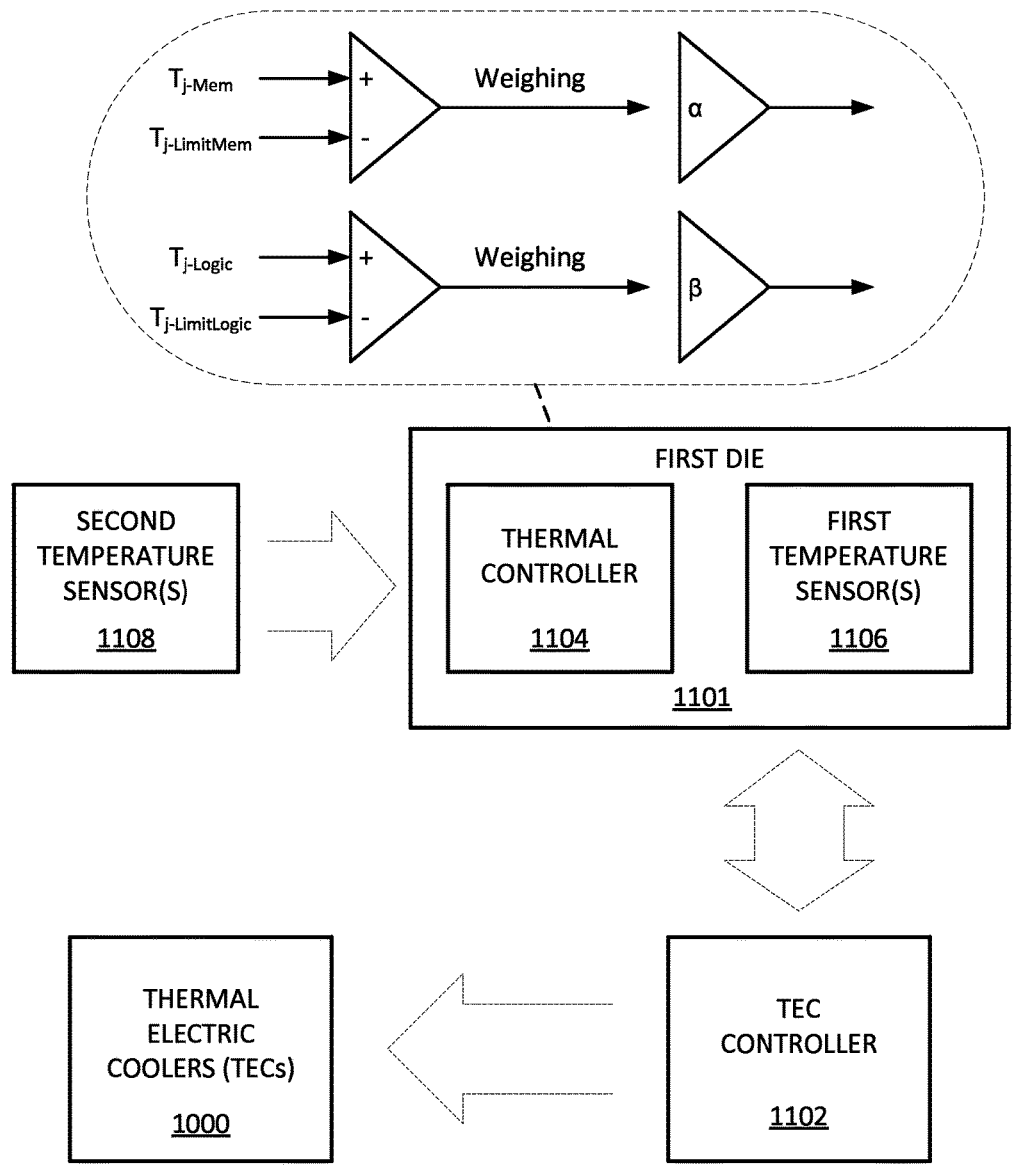
FIG. 11 illustrates another configuration of how a bi-directional thermal electric cooler (TEC) may be controlled by a thermal controller.

Different implementations may provide different configurations of a device that includes at least one TEC. FIG. 11 illustrates an example of another configuration of how one or more thermal electric coolers (TECs) 1000 may be controlled, configured and/or adapted to dissipate heat. The configuration of FIG. 11 includes the TEC 1000, a first die 1101, a TEC controller 1102, a thermal controller 1104, at least one first temperature sensor 1106, and at least one second temperature sensor 1108.

The first die 1101 includes the thermal controller 1104 and the first temperature sensor 1106. The second temperature sensor 1108 may transmit temperature readings (e.g., temperature readings of a second die) to the first die 1101. More specifically, the second temperature sensor 1108 may transmit temperature readings to the thermal controller 1104. Similarly, the first temperature sensor 1106 may transmit temperature readings (e.g., temperature readings of the first die 1101) to the thermal controller 1104. Thus, the thermal controller 1104 may receive temperature readings from the first temperature sensor 1106 and the second temperature sensor 1108. The thermal controller 1104 may be configured to control and regulate operations of a TEC and/or dies so that the dies operate within their operational temperature limits, in a similar manner as described for the thermal controller 1004.

The first die 1101 and the thermal controller 1104 may transmit signals and/or instructions to the TEC controller 1102 so that the TEC controller 1102 can control, adapt and/or configure the TECs 1000. The TEC controller 1102 may control, adapt and/or configure the TECs 1000 by transmitting currents, in a similar manner as described for the TEC controller 1002.

FIG. 11 also illustrates some of the variables that the first die 1201 and/or the thermal controller 1104 may take into account to control, adapt and/or configured one or more TECs 1000. The variables in FIG. 11 are similar to the variables described in FIG. 10, except that the variables may be taken into account by the first die 1201 and/or the thermal controller 1104.

Figure 12:
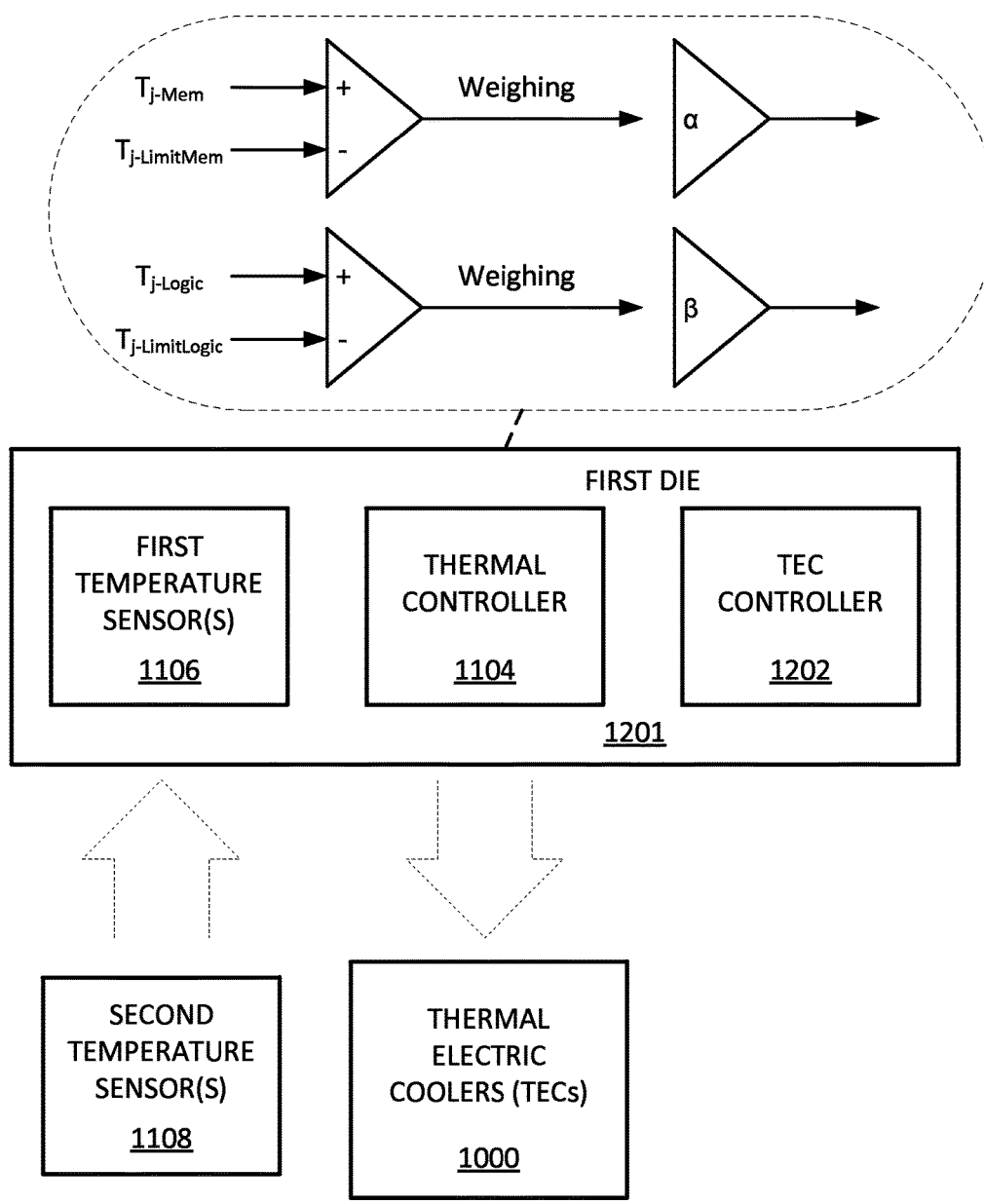
FIG. 12 illustrates another configuration of how a bi-directional thermal electric cooler (TEC) may be controlled by a thermal controller.

FIG. 12 illustrates an example of another configuration of how one or more thermal electric coolers (TECs) 1000 may be controlled, configured and/or adapted to dissipate heat. The configuration of FIG. 12 includes the TECs 1000, a first die 1201, a TEC controller 1202, the thermal controller 1104, at least one first temperature sensor 1106, and at least one second temperature sensor 1108. FIG. 12 is similar FIG. 11, except that the TEC controller 1202 is implemented in the first die 1201. Thus, the configuration of FIG. 12 operates in a similar manner the configuration of FIG. 11, except that the TEC controller 1202 operates within the first die 1201.

FIG. 12 also illustrates some of the variables that the first die 1201 and/or the thermal controller 1104 may take into account to control, adapt and/or configured one or more TECs 1000. The variables in FIG. 12 are similar to the variables described in FIG. 10, except that the variables may be taken into account by the first die 1201 and/or the thermal controller 1104.

It is noted that different implementations may provide different configurations and/or designs of the above TECs, TEC controller, thermal controller, and temperature sensors.

Figure 13:
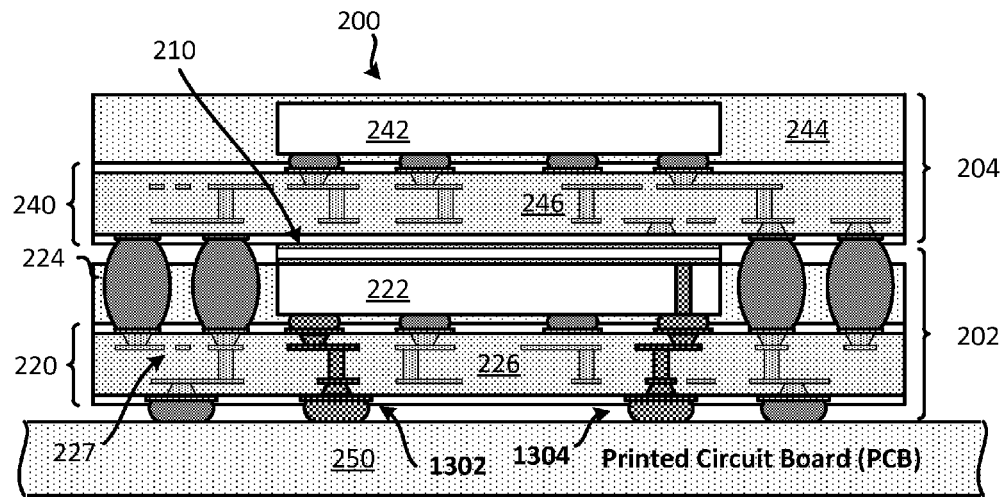
FIG. 13 illustrates a profile view of an example of a package-on-package (PoP) device that includes a bi-directional thermal electric cooler (TEC), where several exemplary electrical paths are highlighted.
Figure 14:
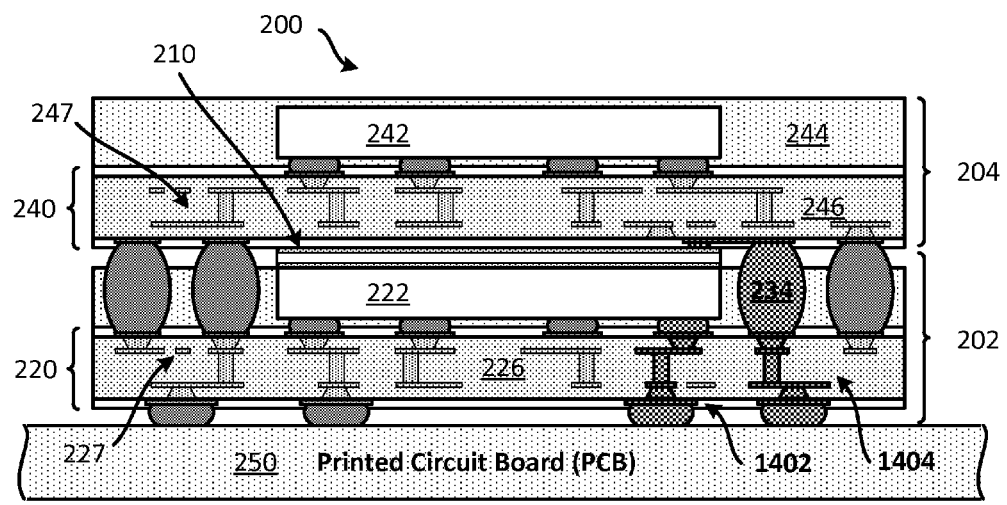
FIG. 14 illustrates a profile view of an example of a package-on-package (PoP) device that includes a bi-directional thermal electric cooler (TEC), where several exemplary electrical paths are highlighted.
Figure 15:
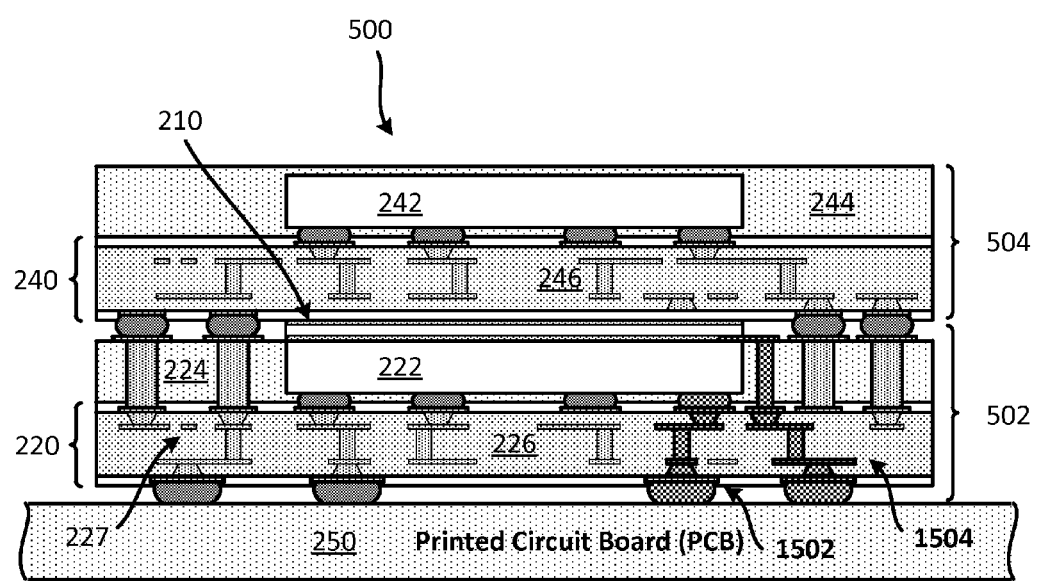
FIG. 15 illustrates a profile view of an example of a package-on-package (PoP) device that includes a bi-directional thermal electric cooler (TEC), where several exemplary electrical paths are highlighted.

Exemplary Connections of Thermal Electric Cooler (TEC) in a Package on Package (PoP) Device FIGS. 13-15 illustrate various examples of how a thermal electric cooler (TEC) in a package on package (PoP) device may be electrically coupled to various components or devices.

FIG. 13 illustrates the PoP device 200 of FIG. 2. As shown in FIG. 13, the first die 222 is electrically coupled to the printed circuit board (PCB) 250 through a first set of interconnects 1302. The first set of interconnects 1302 may include a solder (from solder 225), interconnects (e.g., traces, vias, pads) from interconnects 227, and a solder ball (from solder balls 252). The first set of interconnects 1302 may provide an electrical path between the first die 222 a power source (not shown), a thermal controller (not shown), or a thermal electric cooler (TEC) controller (not shown). In some implementations, the thermal controller and/or the TEC controller may be implemented in the first die 222.

FIG. 13 also illustrates the thermal electric cooler (TEC) 210 electrically coupled the PCB 250 through a second set of interconnects 1304. The second set of interconnect 1304 may be coupled to pads (e.g., pads 702, 704) and/or terminals on the TEC 210 as described in FIG. 7. The second set of interconnects 1304 may include a through substrate via (TSV) that traverses the first die 222, redistribution layers, a solder (from solder 225), interconnects (e.g., traces, vias, pads) from interconnects 227, and a solder ball (from solder balls 252). The second set of interconnects 1304 may provide an electrical path between the TEC 210 and a TEC controller (not shown).

FIG. 14 illustrates how the TEC 210 may be electrically coupled to different components and/or device in the PoP device 200. As shown in FIG. 14, the first die 222 is electrically coupled to the printed circuit board (PCB) 250 through a first set of interconnects 1402. The first set of interconnects 1402 may include a solder (from solder 225), interconnects (e.g., traces, vias, pads) from interconnects 227, and a solder ball (from solder balls 252). The first set of interconnects 1402 may provide an electrical path between the first die 222 a power source (not shown), a thermal controller (not shown), or a thermal electric cooler (TEC) controller (not shown). In some implementations, the thermal controller and/or the TEC controller may be implemented in the first die 222.

FIG. 14 also illustrates the thermal electric cooler (TEC) 210 electrically coupled the PCB 250 through a second set of interconnects 1404. The second set of interconnect 1404 may be coupled to pads (e.g., pads 702, 704) and/or terminals on the TEC 210 as described in FIG. 7. The second set of interconnects 1404 may include interconnects from interconnect 247, solder 234, interconnects (e.g., traces, vias, pads) from interconnects 227, and a solder ball (from solder balls 252). The second set of interconnects 1404 may provide an electrical path between the TEC 210 and a TEC controller (not shown). In this example, the second set of interconnects 1404 traverses both the second package 204 and the first package 202.

FIG. 15 illustrates the PoP device 200 of FIG. 5. As shown in FIG. 15, the first die 222 is electrically coupled to the printed circuit board (PCB) 250 through a first set of interconnects 1502. The first set of interconnects 1502 may include a solder (from solder 225), interconnects (e.g., traces, vias, pads) from interconnects 227, and a solder ball (from solder balls 252). The first set of interconnects 1502 may provide an electrical path between the first die 222 a power source (not shown), a thermal controller (not shown), or a thermal electric cooler (TEC) controller (not shown). In some implementations, the thermal controller and/or the TEC controller may be implemented in the first die 222.

FIG. 15 also illustrates the thermal electric cooler (TEC) 210 electrically coupled the PCB 250 through a second set of interconnects 1504. The second set of interconnect 1504 may be coupled to pads (e.g., pads 702, 704) and/or terminals on the TEC 210 as described in FIG. 7. The second set of interconnects 1504 may include interconnects from interconnect 512 (e.g., redistribution interconnects), a via (e.g., through mold via (TMV), through encapsulation via (TEV)) from vias 510, interconnects (e.g., traces, vias, pads) from interconnects 227, and a solder ball (from solder balls 252). The second set of interconnects 1504 may provide an electrical path between the TEC 210 and a TEC controller (not shown).

Figure 16:
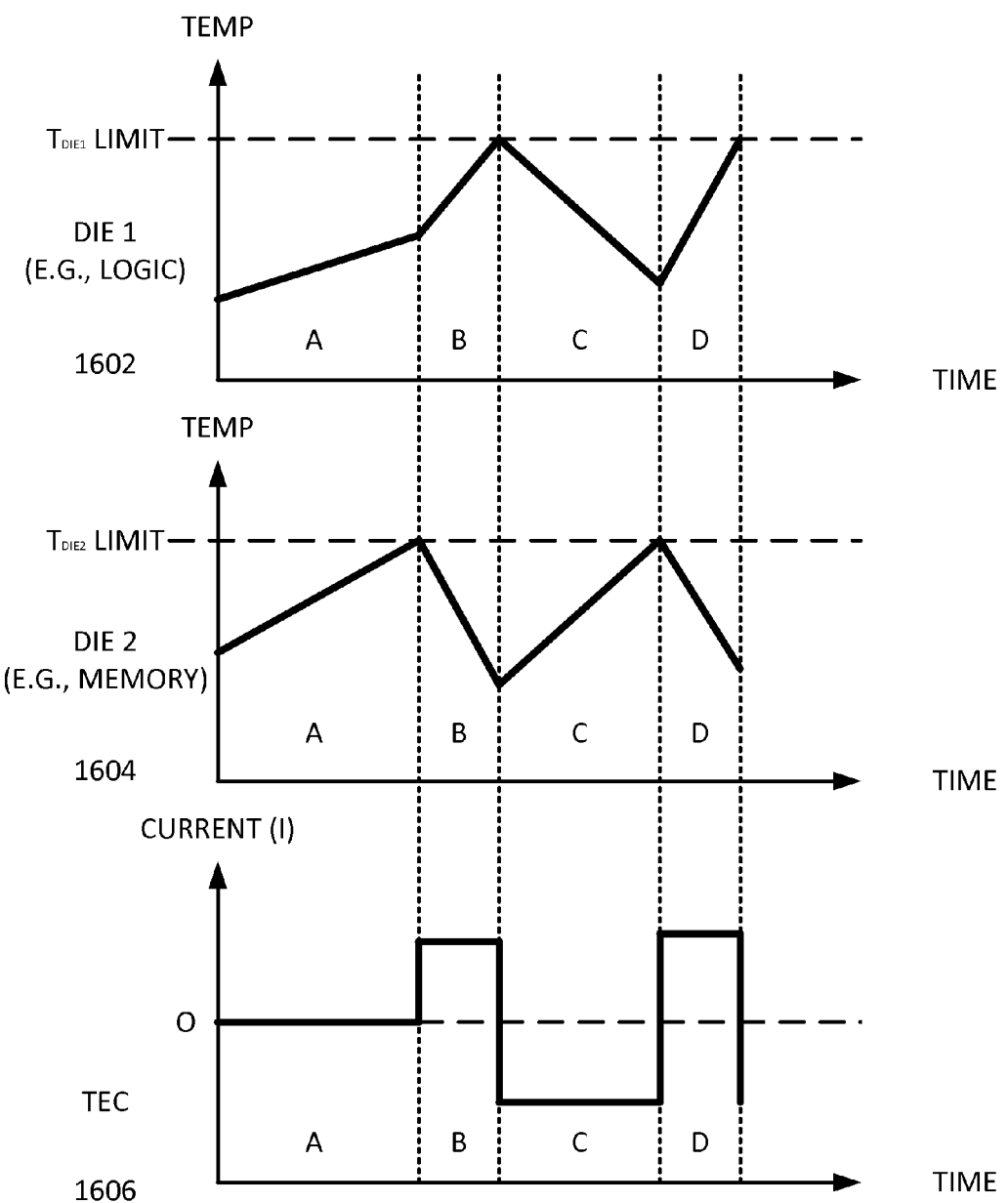
FIG. 16 illustrates several temperature graphs and a TEC current graph to illustrate how the operation of a TEC may affect the temperature of several dies in a package-on-package (PoP) device.

Exemplary Illustration of how the Operation of a Thermal Electric Cooler (TEC) May Affect the Temperatures of Dies FIG. 16 illustrates three graphs of how the operation of a thermal electric cooler (TEC) may affect the temperatures of various dies. FIG. 16 illustrates a first graph 1602, a second graph 1604, and a third graph 1606. The first graph 1602 is a temperature reading of a first die (e.g., during operation of the first die 222) over a time period. The second graph 1604 is a temperature reading of a second die (e.g., during operation of the second die 242) over a time period. The third graph 1606 is current reading that is transmitted to/received by the thermal electric cooler (TEC) (e.g., TEC 210) over a time period.

During the time period A, both the first die and the second die are operational. As time passes, the temperatures of the first die and second die increases. Since both the first die and the second die have operating temperatures that are respectively less than their maximum temperatures (e.g., maximum operating temperatures, first maximum temperature, second maximum temperature), the TEC does not have to operational/active. Thus, no current is transmitted to the TEC or received by the TEC.

At the end of the time period A, the second die has reached its maximum operating temperature (e.g., $T_{DIE2}$). However, the first die has not reached its maximum operating temperature (e.g., $T_{DIE1}$) at the end of the time period A. Thus, heat can be dissipated away from the second die towards the first die. A current (e.g., first current having a first polarity) is transmitted to and received by the TEC, which causes the TEC to dissipate heat away from the second die. The first polarity may be a positive polarity.

During the time period B, after the TEC is activated and while the TEC is active, the temperature of the second die begins to decrease, while the temperature of the first die increases at a faster rate (due to the heat from the second die being transferred to the first). Since the first die is operational, the first die is generating its own heat, while at the same time, the first die is receiving heat from the second die.

At the end of the time period B, the first die has reached its maximum operating temperature, while the second die is now below its maximum operating temperature. In this instance, heat can be dissipated away from the first die and towards the second die. A current with a different polarity (e.g., opposite polarity, second polarity) is transmitted to and received by the TEC. The second polarity may be a negative polarity. The new polarity of the current causes the TEC to dissipate heat away from the first die and towards the second die.

During the time period C, while the TEC is active with a current with a new polarity, the temperature of the first die begins to decrease, while the temperature of the second begins to increase (due to heat generated from the second die and the heat that is transferred from the first die).

At the end of the time period C, the second die has reached it maximum operating temperature, while the first die is now below its maximum operating temperature. The current that is transmitted to and received by the TEC has now been changed back to another polarity (e.g., first polarity, positive polarity), which causes the TEC to again dissipate heat away from the second die.

During the time period D, the temperature of the second die begins to decrease, while the temperature of the first die increases.

Thus, by changing the current that is transmitted to and received by the TEC, the temperatures of the dies may be dynamically controlled without having to throttle the performance of the dies. However, in some implementations, the thermal management and/or control of the dies may be achieved through a combination of limiting the performance of the dies (e.g., throttling one or more dies) and the use of at least one TEC. It is noted that the different implementations may use different currents with different values and polarity to activate, configure and adapt the TEC to dissipate heat.

Having described an example of how thermal management of dies may be achieved by using at least one TEC, several methods for thermal management of dies that includes at least one TEC will now be described in the next sections. In some implementations, the thermal management of the dies may include limiting the performance of one or more dies.

Figure 17:
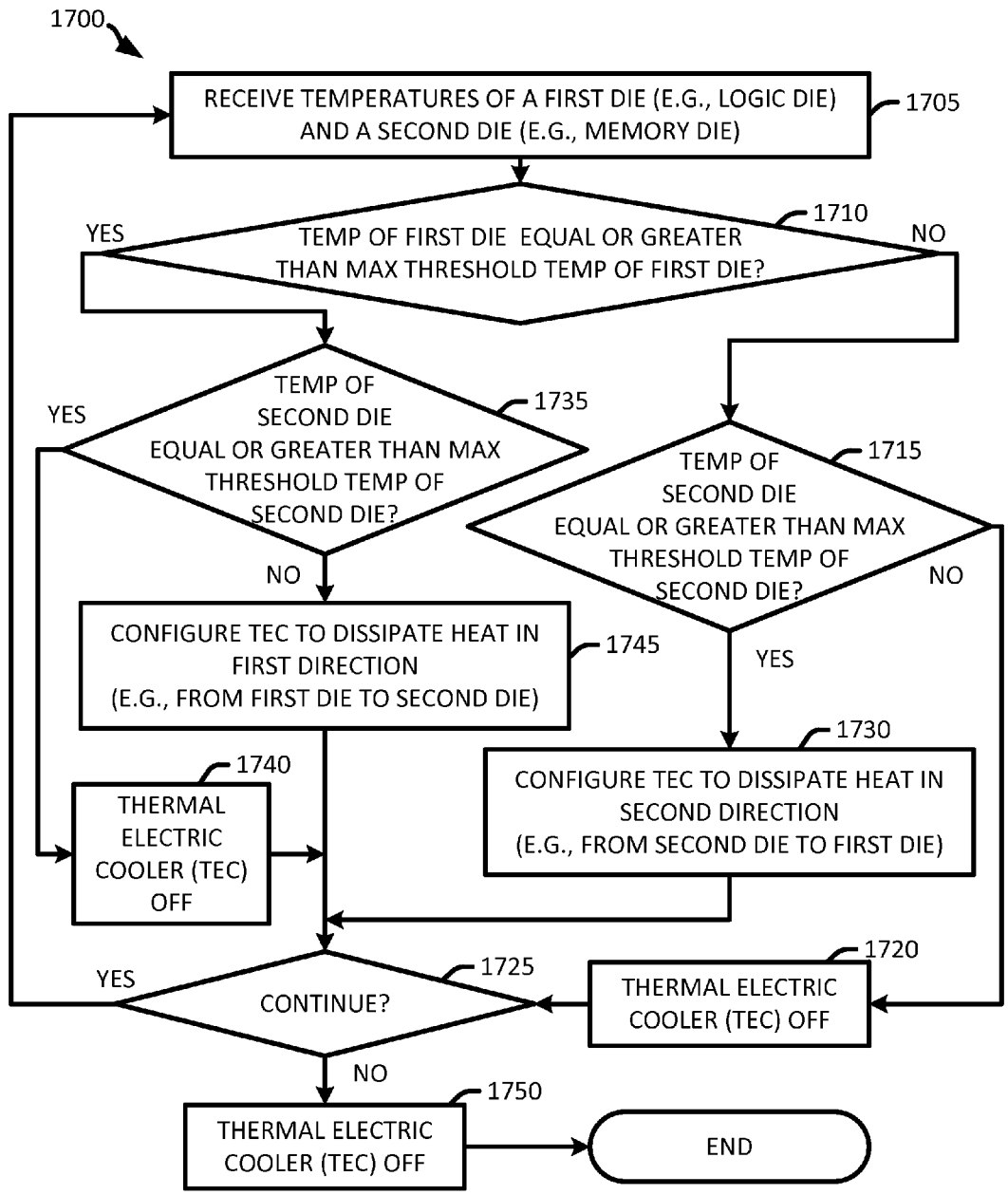
FIG. 17 illustrates an exemplary flow diagram of a method for configuring a bi-directional thermal electric cooler (TEC) and controlling the temperatures of dies in a package-on-package (PoP) device.

Exemplary Flow Diagram of Method for Thermal Management of Dies by Using a Thermal Electric Cooler FIG. 17 illustrates an exemplary flow diagram of a method 1700 for thermal management of two or more dies by using at least one thermal electric cooler (TEC). The method 1700 may be performed by a TEC controller and/or a thermal controller.

The TEC may be active (e.g., on) or inactive (off) before the method 1700. The method receives (at 1705) temperature(s) (e.g., first temperature reading, second temperature reading) of a first die and temperature(s) of a second die. The first die may be the first die 222. The second die may be the second die 242. The temperatures may be temperature readings from at least one first temperature sensor for the first die, and temperature readings from at least one second temperature sensor for the second die.

The method determines (at 1710) whether the temperature of the first die is equal or greater than a maximum threshold operating temperature of the first die. For example, if the maximum threshold operating temperature of the first die is 100° F., the method determines whether the temperature of the first die is equal or greater than 100° F. In instances where there are multiple temperatures (e.g., localized temperatures) for the first die, the method may make several determinations.

When the method determines (at 1710) that the temperature of the first die is not equal or greater than the maximum threshold operating temperature of the first die, the method proceeds to determine (at 1715) whether the temperature of the second die is equal or greater than a maximum threshold operating temperature of the second die. For example, if the maximum threshold operating temperature of the second die is 85° F., the method determines whether the temperature of the second die is equal or greater than 85° F. In instances where there are multiple temperatures (e.g., localized temperatures) for the second die, the method may make several determinations.

When the method determines (at 1715) that the temperature of the second die is not equal or greater than maximum threshold operating temperature of the second die, the method proceeds to instruct (at 1720) the TEC to be inactive (e.g., off). In some implementations, instructing the TEC to be inactive includes not transmitting a current to the TEC. If the TEC is already inactive, then there is no current being transmitted to the TEC. The method then proceeds to determine (at 1725) whether to continue with the thermal management of the dies.

However, referring back to 1715, when the method determines (at 1715) that the temperature of the second die is equal or greater than maximum threshold operating temperature of the second die, the method proceeds to configure (at 1730) and/or adapt the TEC to dissipate heat away from the second die. In such instances, the method may configure and/or adapt the TEC to dissipate heat in a first direction (e.g., direction away from the second die), towards the first die. This may include sending a first current having a first polarity (e.g., positive polarity) to the TEC. The method then proceeds to determine (at 1725) whether to continue with the thermal management of the dies.

Referring back to 1710, when the method determines (at 1710) that the temperature of the first die is equal or greater than the maximum threshold operating temperature of the first die, the method proceeds to determine (at 1735) whether the temperature of the second die is equal or greater than a maximum threshold operating temperature of the second die. In instances where there are multiple temperatures (e.g., localized temperatures) for the second die, the method may make several determinations.

When the method determines (at 1735) that the temperature of the second die is equal or greater than maximum threshold operating temperature of the second die, the method proceeds to configure (at 1740) the TEC to be inactive (e.g., off). In this instance, both the first dies and the second die have temperatures that are greater than their respective maximum threshold temperatures, using the TEC would be not be productive. In such instances, throttling the performance of one or more of the dies (e.g., limiting the clock speed of the dies) may be used to reduce the temperatures of the dies. In some implementations, instructing the TEC to be inactive includes not transmitting a current to the TEC. If the TEC is already inactive, then there is no current being transmitted to the TEC. The method then proceeds to determine (at 1725) whether to continue with the thermal management of the dies.

However, referring back to 1735, when the method determines (at 1735) that the temperature of the second die is not equal or greater than maximum threshold operating temperature of the second die, the method proceeds to configure (at 1745) and/or adapt the TEC to dissipate heat away from the first die. In such instances, the method may configure and/or adapt the TEC to dissipate heat in a second direction (e.g., direction away from the first die), towards the second die. This may include sending a second current having a second polarity (e.g., negative polarity) to the TEC. The method then proceeds to determine (at 1725) whether to continue with the thermal management of the dies.

The method determines (at 1725) whether to continue with the thermal management of the dies. If so, the method proceeds back to receive (at 1705) temperature(s) of the first die and temperature(s) of the second die.

However, when the method determines (at 1725) not to continue with the thermal management of the dies, the method proceeds to configure (at 1745) the TEC to be inactive (e.g., off). This may be achieved by discontinuing transmitting any current to the TEC.

Figure 18:
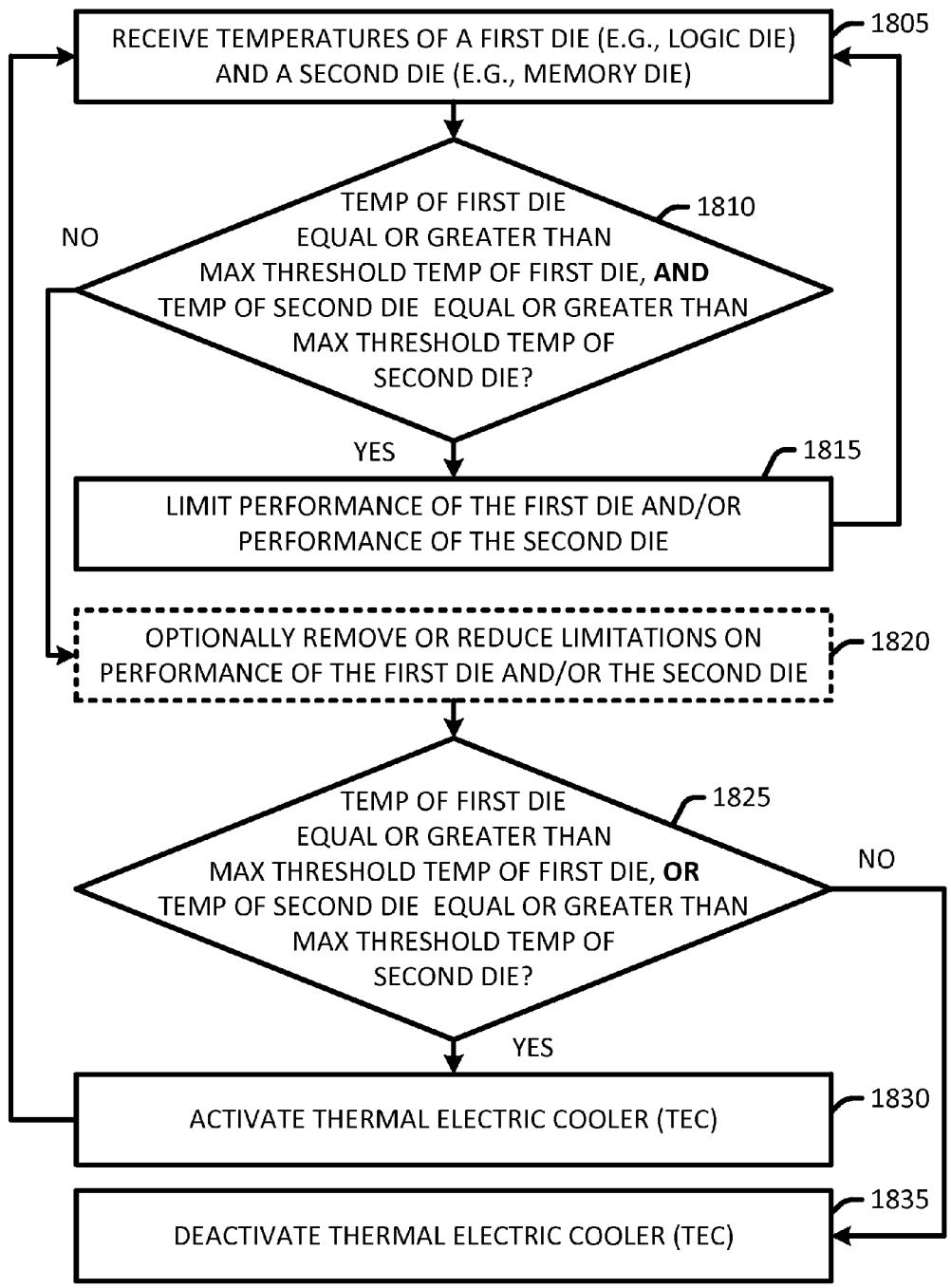
FIG. 18 illustrates another exemplary flow diagram of a method for configuring a bi-directional thermal electric cooler (TEC) and controlling the temperatures of dies in a package-on-package (PoP) device.

Exemplary Flow Diagram of Method for Thermal Management of Dies by Using a Thermal Electric Cooler and/or Performance Limitations on the Dies FIG. 18 illustrates an exemplary flow diagram of another method 1800 for thermal management of two or more dies by using at least one thermal electric cooler (TEC) and/or performance limitations on the dies. The method 1800 may be performed by a TEC controller and/or a thermal controller.

The TEC may be active (e.g., on) or inactive (off) before the method 1800. The method receives (at 1805) temperature(s) (e.g., first temperature reading, second temperature reading) of a first die and temperature(s) of a second die. The first die may be the first die 222. The second die may be the second die 242. The temperatures may be temperature readings from at least one first temperature sensor for the first die, and temperature readings from at least one second temperature sensor for the second die.

The method determines (at 1810) whether the temperature of the first die is equal or greater than a maximum threshold operating temperature of the first die, and the temperature of the second die is equal or greater than a maximum threshold operating temperature of the second die. In instances where there are multiple temperatures (e.g., localized temperatures) for the first die and/or the second die, the method may make several determinations.

When the method determines (at 1810) that both the temperature of the first die is equal or greater than a maximum threshold operating temperature of the first die, and the temperature of the second die is equal or greater than a maximum threshold operating temperature of the second die, the method limits (at 1815) the performance of the first die and/or the second die. In some implementations, limiting the performance of the dies may include throttling the die, such as limiting the maximum clock speeds of one or more dies. Different implementations, may limit the performance of the dies differently. For example, the performance of the first die may be limited more than the performance of the second die.

The method then proceeds to receive (at 1805) temperature(s) of a first die and temperature(s) of a second die.

However, when the method determines (at 1810) that the temperature of the first die is not equal or greater than a maximum threshold operating temperature of the first die, and the temperature of the second die is not equal or greater than a maximum threshold operating temperature of the second die, then method may optionally remove or reduce (at 1820) any limitations on the performances of the first die and/or the second die.

The method determines (at 1825) whether the temperature of the first die is equal or greater than a maximum threshold operating temperature of the first die, or the temperature of the second die is equal or greater than a maximum threshold operating temperature of the second die. In instances where there are multiple temperatures (e.g., localized temperatures) for the first die and/or the second die, the method may make several determinations.

When the method determines (at 1825) that the temperature of the first die is equal or greater than a maximum threshold operating temperature of the first die, or the temperature of the second die is equal or greater than a maximum threshold operating temperature of the second die, the method activates (at 1830) a thermal electric cooler (TEC). This may include sending a current to the TEC. The TEC may be activated to either dissipate heat away from the first die or away from the second die. For example, when the temperature of the first die is equal or greater than a maximum threshold operating temperature of the first die, but the temperature of the second die is not equal or greater than a maximum threshold operating temperature of the second die, the TEC may be activated to dissipate heat away from the first die. When the temperature of the first die is not equal or greater than a maximum threshold operating temperature of the first die, but the temperature of the second die is equal or greater than a maximum threshold operating temperature of the second die, the TEC may be activated to dissipate heat away from the second die. An example of how a TEC may be activated is illustrated and described in FIG. 17. The method then proceeds to receive (at 1805) temperature(s) of the first die and temperature(s) of the second die.

When the method determines (at 1825) that the temperature of the first die is not equal or greater than a maximum threshold operating temperature of the first die, and the temperature of the second die is not equal or greater than a maximum threshold operating temperature of the second die, the method deactivates (at 1835) the thermal electric cooler (TEC). Deactivating the TEC may include not transmitting a current to the TEC. When the TEC is already inactive, no current is transmitted either. It is noted that in some implementations, the same current or different currents (e.g., current with different amperes) may be transmitted. In some implementations, a stronger current (e.g., current with a greater ampere) will provide greater active heat dissipation than a weaker current (e.g., current with a lower ampere). Different implementations may use different factors and/or variables to consider the strength of the current. Such factors and/or variables may include the source of the power of the package (e.g., battery power, plug-in power) and/or rate of temperature change of the dies.

The method of 1800 may be iterated several times until thermal management of the dies ends.

Exemplary Sequence for Providing/Fabricating a Package on Package (PoP) Device Comprising Bi-Directional Thermal Electric Cooler (TEC)

Figure 19A:
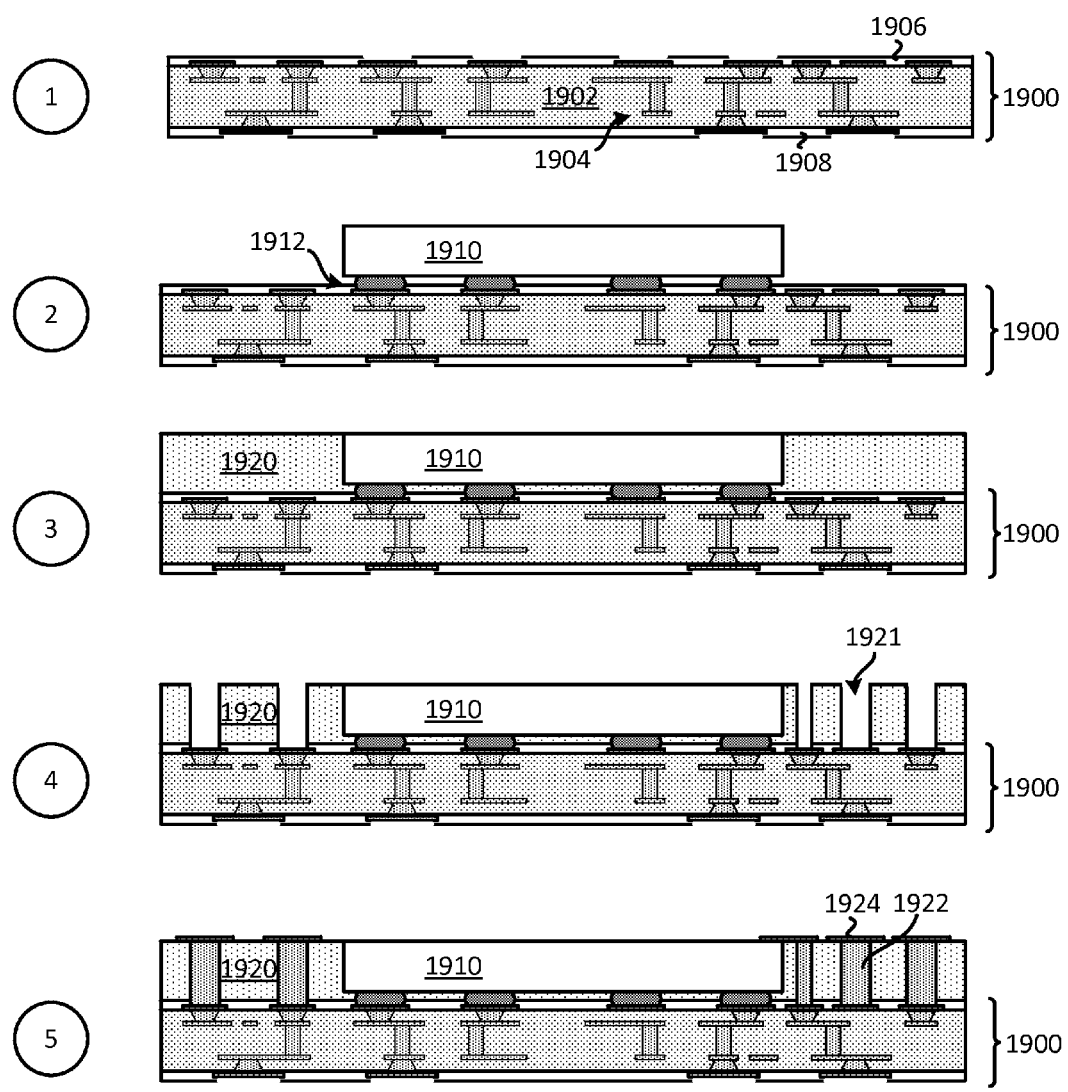
FIG. 19 (which includes FIGS. 19A-19B) illustrates an exemplary sequence for fabricating a package-on-package (PoP) device that includes a bi-directional thermal electric cooler (TEC).
Figure 19B:
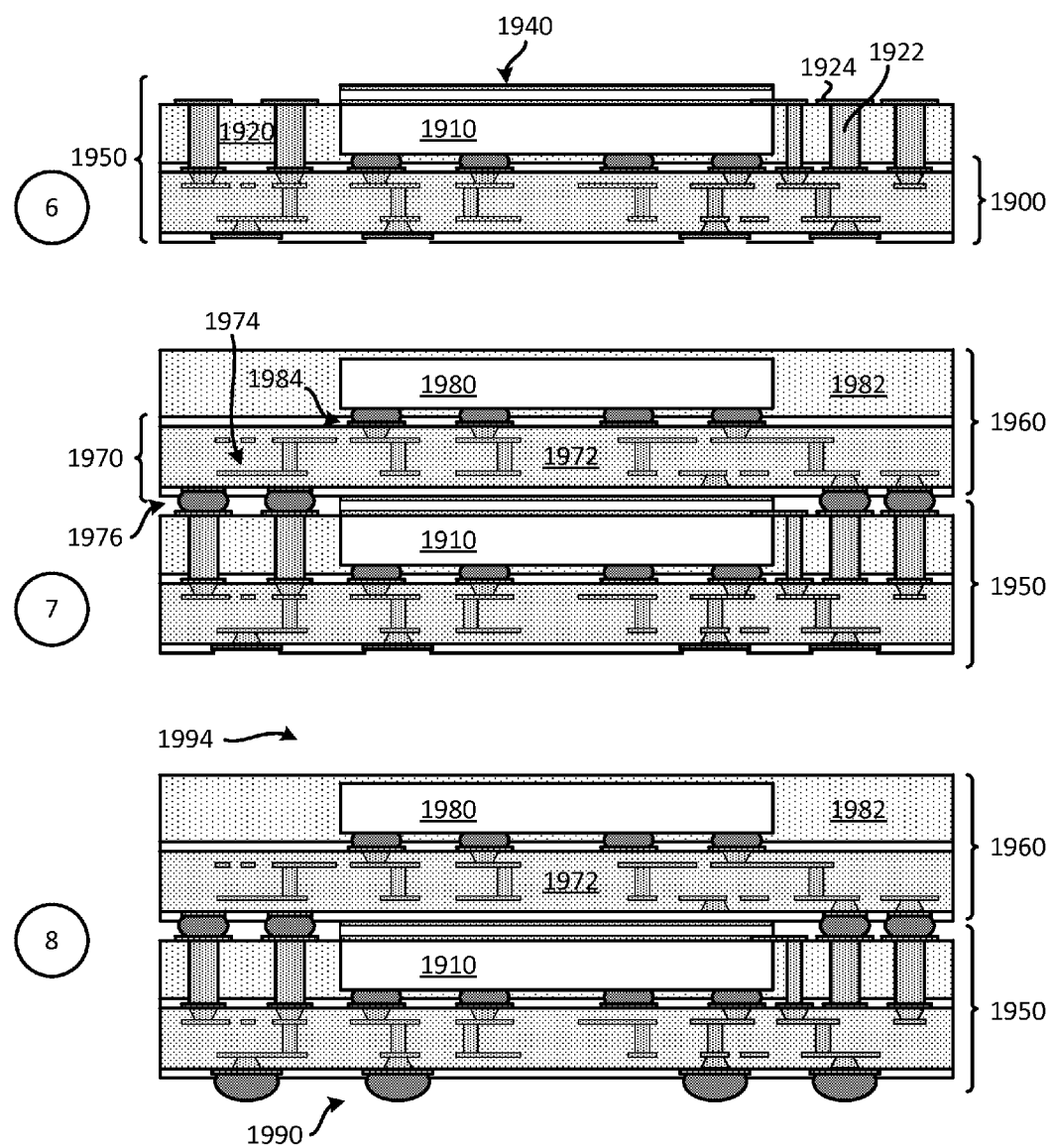

In some implementations, providing/fabricating a package on package (PoP) device that includes at least one bi-directional thermal electric cooler (TEC) includes several processes. FIG. 19 (which includes FIGS. 19A-19B) illustrates an exemplary sequence for providing/fabricating a PoP device that includes at least one bi-directional thermal electric cooler (TEC). In some implementations, the sequence of FIGS. 19A-19C may be used to provide/fabricate the PoP device of FIGS. 2-5 and/or other PoP devices described in the present disclosure.

It should be noted that the sequence of FIGS. 19A-19C may combine one or more stages in order to simplify and/or clarify the sequence for providing/fabricating a PoP device that includes a bi-directional thermal electric cooler (TEC). In some implementations, the order of the processes may be changed or modified.

Stage 1, as shown in FIG. 19A, illustrates a state after a substrate 1900 is provided. The substrate 1900 may be a package substrate. The substrate 1900 may be fabricated or supplied by a supplier or manufacturer. The substrate 1900 includes at least one dielectric layer 1902, a set of interconnects 1904 (e.g., traces, vias, pads), a first solder resist layer 1906 and a second solder resist layer 1908. The dielectric layer 1902 may include a core layer and/or a prepeg layer.

Stage 2 illustrates a state after a first die 1910 is coupled (e.g., mounted) to the substrate 1900. The first die 1910 is coupled to the substrate 1900 through a set of solder 1912 (e.g., solder balls). Different implementations may couple the first die 1910 to the substrate 1900 differently. In some implementations, the first die 1910 is coupled to the substrate 1900 through a set of pillars and solder.

Stage 3 illustrates a state after an encapsulation layer 1920 is provided (e.g., formed) on the substrate 1900 and the first die 1910. The encapsulation layer 1920 may encapsulate the entire first die 1910 or just part of the first die 1910. The encapsulation layer 1920 may be a mold and/or epoxy fill.

Stage 4 illustrates a state after at least one cavity 1921 is formed in the encapsulation layer 1920. Different implementations may form the cavity 1921. In some implementations, a laser is used to form the cavity 1921. In some implementations, the encapsulation layer 1920 is a photo-patternable layer, and the cavity 1921 can be formed by using a photo-lithography process (e.g., photo-etching process) to pattern the encapsulation layer 1920.

Stage 5 illustrates a state after at least one via 1922 and at least one interconnect 1924 are formed in and on the encapsulation layer 1920. A plating process may be used to form the via 1922 and the interconnect 1924. The interconnect 1924 may include a trace and/or a pad. The interconnect 1924 may be a redistribution interconnect. The via 1922 and the interconnect 1924 may each include a seed metal layer and metal layer.

Stage 6, as shown in FIG. 19B, illustrates a state after a thermal electric cooler (TEC) 1940 is coupled (e.g., mounted) to the first die 1910. In some implementations, an adhesive (e.g., thermally conductive adhesive) is used to couple the TEC 1940 to the first die 1910. The TEC 1940 may be a bi-directional TEC. The TEC 1940 includes pads and/or terminals (e.g., as described in FIG. 7). The TEC 1940 may coupled to the first die 1910 such that the pads and/or terminals of the TEC 1940 are coupled (e.g., electrically coupled) to interconnects on the encapsulation layer 1920 (e.g., redistribution interconnects, interconnect from interconnects 1924). Stage 6 may illustrate a first package 1950 that includes the substrate 1900, the first die 1910, and the encapsulation layer 1920. The first package 1950 may also include the TEC 1940.

Stage 7 illustrates a state after a second package 1960 is coupled (e.g., mounted) to the first package 1950, such that the TEC 1940 is between the first package 1950 and the second package 1960. The second package 1960 includes a second substrate 1970 (e.g., package substrate), a second die 1980, and a second encapsulation layer 1982. The second substrate 1970 includes at least one dielectric layer 1972 and a set of interconnects 1974 (e.g., traces, pads, vias). A set of solder balls 1976 may be coupled to the second substrate 1970 and interconnects (e.g., interconnect 1924) from the first package 1950. The second die 1980 is coupled (e.g., mounted) to the second substrate 1970 through a set of solder 1984 (e.g., solder balls). As shown at stage 7, the TEC 1940 is located between the first die 1910 and the second substrate 1970. In some implementations, an adhesive (e.g., thermal conductive adhesive) is used to couple the second substrate 1970 to the TEC 1940.

Stage 8 illustrates a state after a set of solder balls 1990 is coupled to the first package 1950. Stage 8 may include a package on package (PoP) device 1994, which includes the first package 1950, the second package 1960 and the TEC 1940.

Exemplary Method for Providing/Fabricating a Package on Package (PoP) Device Comprising Bi-Directional Thermal Electric Cooler (TEC)

Figure 20:
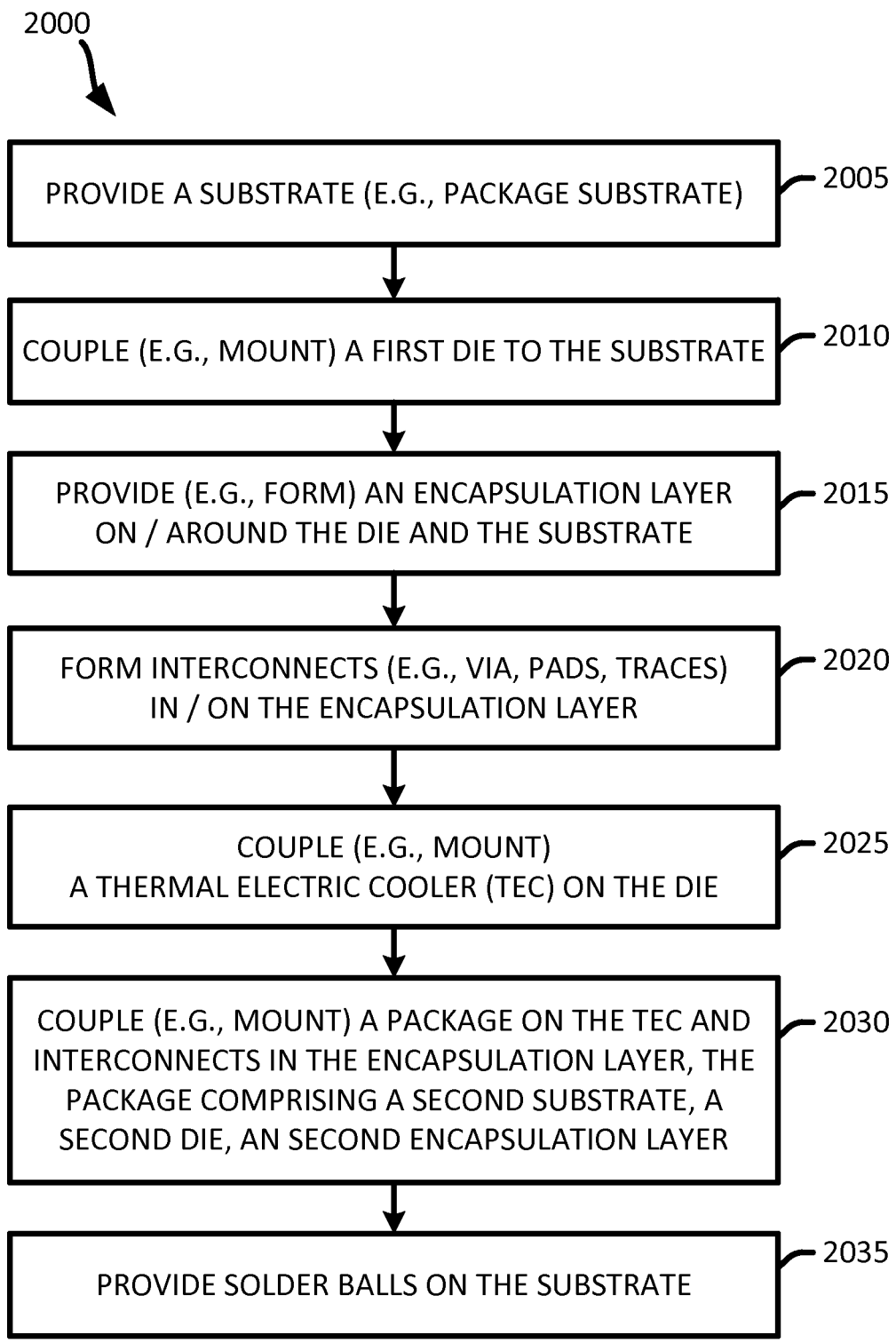
FIG. 20 illustrates an exemplary flow diagram of a method for fabricating a package-on-package (PoP) device that includes a bi-directional thermal electric cooler.

FIG. 20 illustrates an exemplary flow diagram of a method 2000 for providing/fabricating a package on package (PoP) device that includes at least one bi-directional thermal electric cooler (TEC). In some implementations, the method 2000 of FIG. 20 may be used to provide/fabricate the PoP device of FIGS. 2-5 and/or other PoP devices in the present disclosure.

It should be noted that the flow diagram of FIG. 20 may combine one or more step and/or processes in order to simplify and/or clarify the method for providing a PoP device that includes a bi-directional TEC. In some implementations, the order of the processes may be changed or modified.

The method provides (at 2005) a substrate. The substrate may be a package substrate. The substrate may be fabricated or supplied by a supplier or manufacturer. The substrate includes at least one dielectric layer, a set of interconnects (e.g., traces, vias, pads), a first solder resist layer and a second solder resist layer. The dielectric layer may include a core layer and/or a prepeg layer.

The method couples (at 2010) a first die to the substrate. The first die may be coupled (e.g., mounted) to the substrate through a set of solder (e.g., solder balls). Different implementations may couple the first die to the substrate differently. In some implementations, the first die is coupled to the substrate through a set of pillars and solder.

The method optionally provides (at 2015) an encapsulation layer on the substrate and the first die. In some implementations, providing the encapsulation layer includes forming the encapsulation layer on the substrate and the first die such that the encapsulation layer encapsulates the entire first die or just part of the first die. The encapsulation layer may be a mold and/or epoxy fill.

The method forms (at 2020) interconnects in and on the encapsulation layer. In some implementations, forming interconnects includes forming cavities in the encapsulation layer and forming interconnects in the cavity and/or the encapsulation layer. Different implementations may form the cavities. In some implementations, a laser is used to form the cavities. In some implementations, the encapsulation layer is a photo-patternable layer, and the cavities may be formed by using a photo-lithography process (e.g., photo-etching process) to pattern the encapsulation layer.

Forming the interconnects may include forming at least one via and at least one interconnect in and on the encapsulation layer 1920. A plating process may be used to form the vias and the interconnects. The interconnects may include a trace and/or a pad. The interconnects may be a redistribution interconnect. The vias and the interconnects may each include a seed metal layer and metal layer.

The method couples (at 2025) a thermal electric cooler (TEC) to the first die. In some implementations, an adhesive (e.g., thermally conductive adhesive) is used to couple (e.g., mount) the TEC to the first die. The TEC may be a bi-directional TEC. A first package may be defined by the first substrate, the first die, the encapsulation layer. The first package may also include the TEC coupled to the first die.

The method couples (at 2030) a second package to the first package, such that the TEC is between the first package and the second package. The second package includes a second substrate (e.g., package substrate), a second die, and a second encapsulation layer. The second substrate includes at least one dielectric layer and a set of interconnects (e.g., traces, pads, vias). A set of solder balls may be coupled to the second substrate and interconnects from the first package. The TEC is located between the first die (of the first package) and the second substrate (of the second package). In some implementations, an adhesive (e.g., thermal conductive adhesive) is used to couple the second substrate to the TEC.

The method provides (at 2035) a set of solder balls to the first package. More specifically, the set of solder balls may be coupled to the first substrate of the first package.

Figure 21:
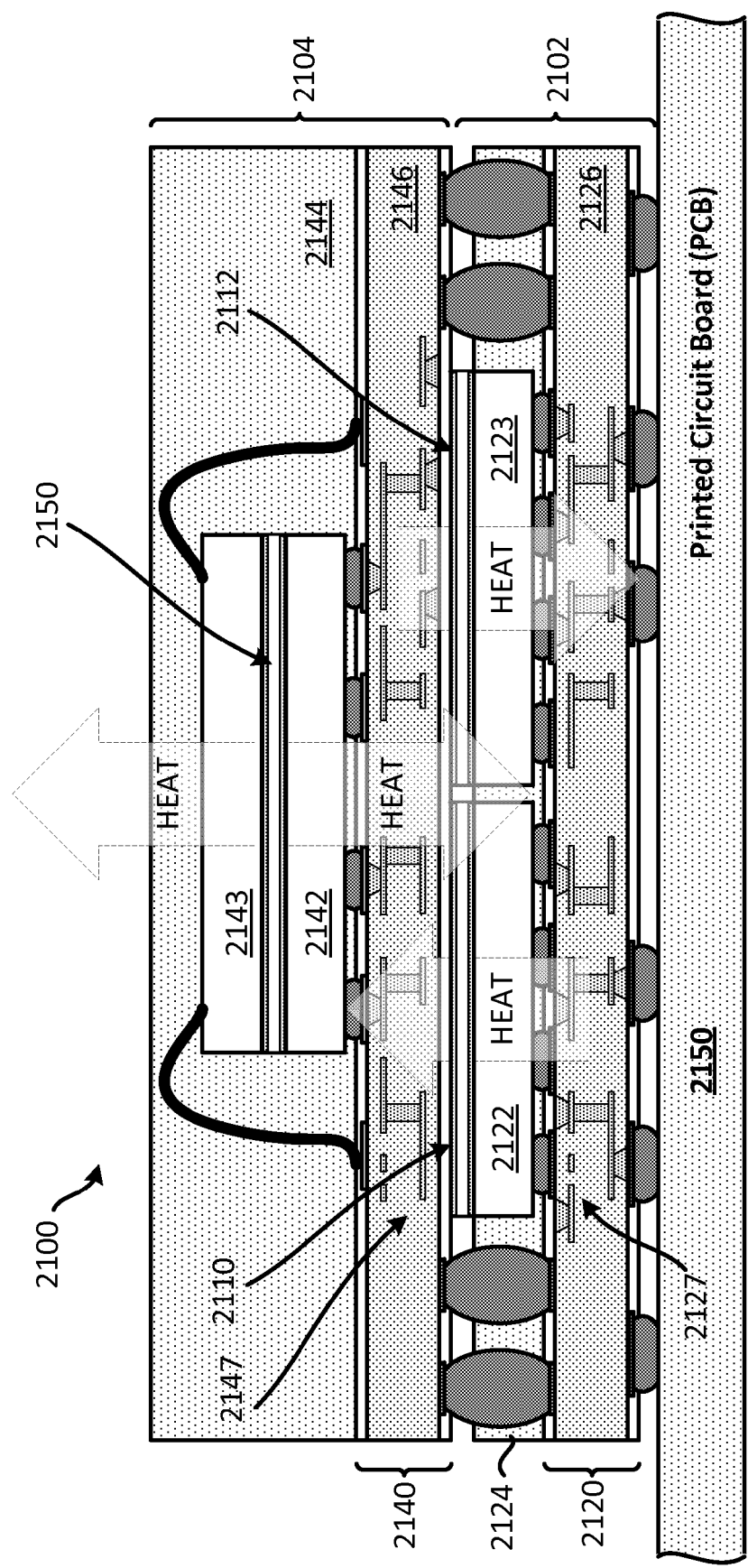
FIG. 21 illustrates a profile view of another example of a package-on-package (PoP) device that includes a bi-directional thermal electric cooler (TEC).

Exemplary Package on Package (PoP) Device Comprising Bi-Directional Thermal Electric Cooler FIG. 21 illustrates an example of another package on package (PoP) device 2100 that includes a first package 2102 (e.g., first integrated device package), a second package 2104 (e.g., second integrated device package), a first thermal electric cooler (TEC) 2110, and a second TEC 2112. In some implementations, the first thermal electric cooler (TEC) 2110 and the second TEC 2112 may be configured as an assembly or an array of TECs, as described in FIGS. 8-9.

The first package 2102 includes a first substrate 2120, a first die 2122 (e.g., first logic die), a second die 2123 (e.g., second logic die), and a first encapsulation layer 2124. The first substrate 2120 includes at least one dielectric layer 2126 and a set of interconnects 2127. The first package 2102 may also include the first TEC 2110 and the second TEC 2112. The first TEC 2110 is coupled to the first die 2122. The second TEC 2112 is coupled to the second die 2123. An adhesive (e.g., thermally conductive adhesive) may be used to couple the TECs (e.g., first TEC 2110) to the first dies (e.g., die 2122).

The second package 2104 is coupled (e.g., mounted) to the first package 2102, such that the first TEC 2110 and the second TEC 2112 are between the first package 2102 and the second package 2104. The second package 2104 includes a second substrate 2140, a first die 2142, a second die 2143, a first encapsulation layer 2144, and a third TEC 2150. The second substrate 2140 includes at least one dielectric layer 2146 and a set of interconnects 2147. The first TEC 2110 is between the first die 2122 and the second substrate 2140. The second TEC 2112 is between the second die 2123 and the second substrate 2140. The third TEC 2150 is between the first die 2142 and the second die 2143.

The first TEC 2110 may be a bi-directional TEC capable of dissipating heat in a first direction (e.g., in a first time period/frame) and a second direction (e.g., in a second time period/frame), where the second direction is opposite to the first direction. Similarly, the second TEC 2112 may be a bi-directional TEC capable of dissipating heat in a first direction (e.g., in a first time period/frame) and a second direction (e.g., in a second time period/frame), where the second direction is opposite to the first direction. The third TEC 2150 may be a bi-directional TEC capable of dissipating heat in a first direction (e.g., in a first time period/frame) and a second direction (e.g., in a second time period/frame), where the second direction is opposite to the first direction.

In some implementations, the TECs 2110 and 2112 may be bi-directional TECs that may be configured and/or adapted to dynamically (e.g., in real time during operation of the PoP device 2100) dissipate heat back and forth between the first package 2102 and the second package 2104, as described in FIGS. 3-4.

In some implementations, the TECs 2110 and 2112 may be bi-directional TECs that may be configured and/or adapted to dynamically (e.g., in real time during operation of the PoP device 2100) dissipate heat back and forth between the first die 2122 and the second die 2123. That is, the TECs 2110 and 2112 may be configured such that heat that is dissipated away from the first die 2122 may be dissipated towards the second die 2123. Thus, in some implementations, the TECs 2110 and 2112 may be configured so that heat dissipates from the first die 2122, through the first TEC 2110, the second substrate 2140, the second TEC 2112, and to the second die 2123.

In some implementations, the TECs 2110 and 2112 may be configured such that heat that is dissipated away from the second die 2123 may be dissipated towards the first die 2122. Thus, in some implementations, the TECs 2110 and 2112 may be configured so that heat dissipates from the second die 2123, through the second TEC 2112, the second substrate 2140, the first TEC 2110, and to the first die 2122.

In some implementations, the TEC 2150 may be a bi-directional TEC that may be configured and/or adapted to dynamically (e.g., in real time during operation of the PoP device 2100) dissipate heat back and forth between the first die 2142 and the second die 2143. That is, for example, the TEC 2150 and 2150 may be configured such that heat that is dissipated away from the first die 2142 may be dissipated towards the second die 2143. Different implementations may configure the TECS differently to achieve a desired thermal management of the dies in the PoP device 2100.

Exemplary Electronic Devices

Figure 22:
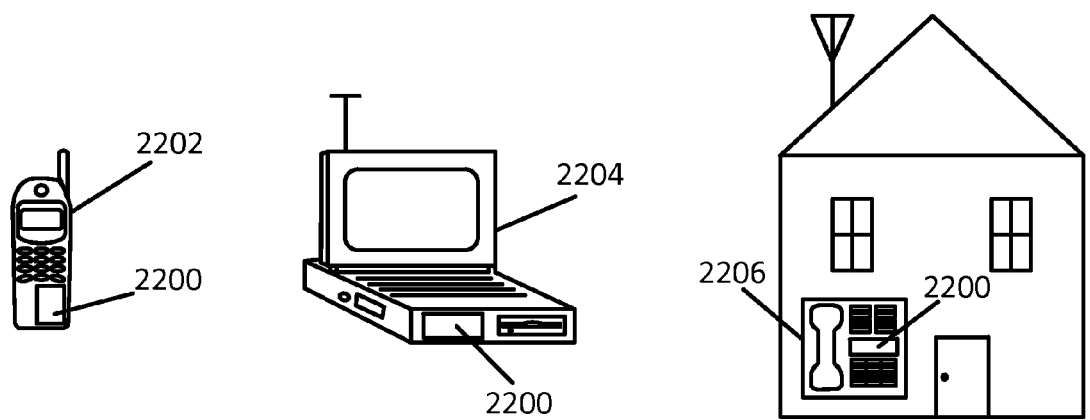
FIG. 22 illustrates various electronic devices that may integrate a package-on-package (PoP) device, an integrated device package, a semiconductor device, a die, an integrated circuit and/or PCB described herein.

FIG. 22 illustrates various electronic devices that may be integrated with any of the aforementioned integrated device, semiconductor device, integrated circuit, die, interposer, package or package-on-package (PoP). For example, a mobile phone device 2202, a laptop computer device 2204, and a fixed location terminal device 2206 may include an integrated device 2200 as described herein. The integrated device 2200 may be, for example, any of the integrated circuits, dies, integrated devices, integrated device packages, integrated circuit devices, package-on-package devices described herein. The devices 2202, 2204, 2206 illustrated in FIG. 22 are merely exemplary. Other electronic devices may also feature the integrated device 2200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, steps, features, and/or functions illustrated in FIGS. 2, 3, 4, 5, 6, 7, 8, 19, 10, 11, 12, 13, 14, 15, 16, 17, 18, 19A-19B, 20, 21 and/or 22 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 19, 10, 11, 12, 13, 14, 15, 16, 17, 18, 19A-19B, 20, 21 and/or 22 and its corresponding description in the present disclosure is not limited to dies and/or ICs. In some implementations, FIGS. 2, 3, 4, 5, 6, 7, 8, 19, 10, 11, 12, 13, 14, 15, 16, 17, 18, 19A-19B, 20, 21 and/or 22 and its corresponding description may be used to manufacture, create, provide, and/or produce integrated devices. In some implementations, a device may include a die, a die package, an integrated circuit (IC), an integrated device, an integrated device package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function. Any of the above methods and/or processes may also be code that is stored in a computer/processor readable storage medium that can be executed by at least one processing circuit, processor, die and/or controller (e.g., TEC controller, thermal controller). For example, the die, the TEC controller, and/or the thermal controller may include one or more processing circuits that may execute code stored in a computer/processor readable storage medium. A computer/processor readable storage medium may include a memory (e.g., memory die, memory in a logic die, memory in TEC controller, memory in thermal controller). A die may be implemented as a flip chip, a wafer level package (WLP), and/or a chip scale package (CSP).

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the disclosure described herein can be implemented in different devices and/or systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package on package (PoP) device comprising:
   a first package comprising:
      a first substrate; and
      a first die coupled to the first substrate;
   a second package coupled to the first package, the second package comprising:
      a second substrate; and
      a second die coupled to the second substrate; and
   a bi-directional thermal electric cooler (TEC) located between the first die and the second substrate, the bi-directional TEC being adapted to dynamically dissipate heat back and forth between the first package and the second package, wherein the bi-directional thermal electric cooler (TEC) is configured to:
      dissipate heat away from the first die when (i) a first temperature reading of the first die, is equal or greater than a first maximum temperature for the first die, and (ii) a second temperature reading of the second die, is less than a second maximum temperature for the second die; and
      dissipate heat away from the second die when (i) the second temperature reading is equal or greater than the second maximum temperature, and (ii) the first temperature reading is less than the first maximum temperature.

2. The PoP device of claim 1, wherein the bi-directional TEC is adapted to dissipate heat away from the first die and towards the second die, in a first time period.

3. The PoP device of claim 2, wherein the bi-directional TEC is further adapted to dissipate heat away from the second die and towards the first die, in a second time period.

4. The PoP device of claim 2, wherein the bi-directional TEC is adapted to dissipate heat away from the first die and towards the second die through the second substrate.

5. The PoP device of claim 1, wherein the bi-directional TEC is coupled to the first die through a first thermally conductive adhesive.

6. The PoP device of claim 1, wherein the bi-directional TEC is an array of a plurality of thermal electric coolers (TECs).

7. The PoP device of claim 1, wherein the bi-directional TEC is electrically coupled to a TEC controller through a plurality of interconnects that includes interconnects in the first die.

8. The PoP device of claim 1, wherein the bi-directional TEC is electrically coupled to a TEC controller through a plurality of interconnects that includes interconnects in the first encapsulation layer.

9. The PoP device of claim 1, wherein the bi-directional TEC is electrically coupled to a TEC controller through a plurality of interconnects that includes interconnects in the second substrate.

10. The PoP device of claim 1, wherein the first die is a first logic die and the second die is one of at least a second logic die or a memory die.

11. The PoP device of claim 1, wherein the first package further comprises a third die coupled to the first substrate, wherein the bi-directional TEC is further adapted to dynamically dissipate heat back and forth between the first die and the third die.

12. The PoP device of claim 1, wherein the first package further comprises a third die coupled to the first substrate, wherein the PoP device further comprises a second bi-directional TEC, wherein the combination of the bi-directional TEC and the second bi-directional TEC is adapted to dynamically dissipate heat back and forth between the first die and the third die.

13. The PoP device of claim 1, wherein the PoP device is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

14. A package on package (PoP) device comprising:
a first package comprising:
a first substrate; and
a first die coupled to the first substrate;
a second package coupled to the first package, the second package comprising:
a second substrate; and
a second die coupled to the second substrate; and
a bi-directional heat transfer means located between the first die and the second substrate, the bi-directional heat transfer means being configured to dynamically dissipate heat back and forth between the first package and the second package, wherein the bi-directional heat transfer means is configured to:
dissipate heat away from the first die when (i) a first temperature reading of the first die, is equal or greater than a first maximum temperature for the first die, and (ii) a second temperature reading of the second die, is less than a second maximum temperature for the second die; and
dissipate heat away from the second die when (i) the second temperature reading is equal or greater than the second maximum temperature, and (ii) the first temperature reading is less than the first maximum temperature.

15. The PoP device of claim 14, wherein the bi-directional heat transfer means is configured to dissipate away heat from the first die and towards the second die in a first time period.

16. The PoP device of claim 15, wherein the bi-directional heat transfer means is further configured to dissipate heat away from the second die and towards the first die, in a second time period.

17. The PoP device of claim 15, wherein the bi-directional heat transfer means is configured to dissipate heat away from the first die and towards the second die through the second substrate.

18. The PoP device of claim 14, wherein the bi-directional heat transfer means is an array of a plurality of thermal electric coolers (TECs).

19. The PoP device of claim 15, wherein the PoP device is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

20. A method for thermal management of a package on package (POP) device, comprising:
receiving a first temperature reading of a first die;
receiving a second temperature reading of a second die;
determining whether the first temperature reading of the first die is equal or greater than a first maximum temperature for the first die;
determining whether the second temperature reading of the second die is equal or greater than a second maximum temperature for the second die;
configuring a bi-directional thermal electric cooler (TEC) to dissipate heat away from the first die when (i) the first temperature reading is equal or greater than the first maximum temperature, and (ii) the second temperature reading is less than the second maximum temperature; and
configuring the bi-directional thermal electric cooler (TEC) to dissipate heat away from the second die when (i) the second temperature reading is equal or greater than the second maximum temperature, and (ii) the first temperature reading is less than the first maximum temperature.

21. The method of claim 20, wherein configuring the bi-directional TEC to dissipate heat away from the first die comprises configuring a TEC controller to send a first signal to the bi-directional TEC, wherein the first signal has a first polarity.

22. The method of claim 21, wherein configuring the bi-directional TEC to dissipate heat away from the second die comprises configuring the TEC controller to send a second signal to the bi-directional TEC, wherein the second signal has a second polarity that is opposite to the first polarity.

23. The method of claim 20 further comprising configuring the bi-directional TEC to be inactive when (i) the first temperature reading is less than the first maximum temperature, and (ii) the second temperature reading is less than the second maximum temperature.

24. The method of claim 20, wherein the method of receiving the first temperature reading, receiving the second temperature reading, determining whether the first temperature reading of the first die is equal or greater than a first maximum temperature of the first die, and determining whether the second temperature reading of the second die is equal or greater than a second maximum temperature of the second die is performed by a thermal controller.

25. The method of claim 24, wherein the thermal controller is implemented in the first die of the PoP device.

26. The method of claim 20, wherein receiving the first temperature reading of the first die comprises receiving at least one first temperature from at least one first temperature sensor, and wherein receiving the second temperature reading of the second die comprises receiving at least one second temperature from at least one second temperature sensor.

27. The method of claim 21 further comprising instructing the first die to reduce a first die performance when (i) the first temperature reading is equal or greater than the first maximum temperature, and (ii) the second temperature reading is equal or greater than the second maximum temperature.

28. The method of claim 27 further comprising configuring the bi-directional TEC to be inactive when (i) the first temperature reading is equal or greater than the first maximum temperature, and (ii) the second temperature reading is equal or greater than the second maximum temperature.

29. The method of claim 21 further comprising instructing the second die to reduce a second die performance when (i) the first temperature reading is equal or greater than the first maximum temperature, and (ii) the second temperature reading is equal or greater than the second maximum temperature.

30. A non-transitory processor readable storage medium comprising one or more instructions for performing thermal management of a package on package (POP) device, which when executed by at least one processing circuit, causes the at least one processing circuit to:
receive a first temperature reading of a first die;
receive a second temperature reading of a second die;
determine whether the first temperature reading of the first die is equal or greater than a first maximum temperature for the first die;
determine whether the second temperature reading of the second die is equal or greater than a second maximum temperature for the second die;
configure a bi-directional thermal electric cooler (TEC) to dissipate heat away from the first die when (i) the first temperature reading is equal or greater than the first maximum temperature, and (ii) the second temperature reading is less than the second maximum temperature; and
configure the bi-directional thermal electric cooler (TEC) to dissipate heat away from the second die when (i) the second temperature reading is equal or greater than the second maximum temperature, and (ii) the first temperature reading is less than the first maximum temperature.

31. The PoP device of claim 1, wherein the bi-directional thermal electric cooler (TEC) is configured to:
dissipate heat away from the first die and towards the second package when (i) the first temperature reading of the first die, is equal or greater than the first maximum temperature for the first die, and (ii) the second temperature reading of the second die, is less than a second maximum temperature for the second die; and
dissipate heat away from the second die and towards the first package when (i) the second temperature reading is equal or greater than the second maximum temperature, and (ii) the first temperature reading is less than the first maximum temperature.

32. The PoP device of claim 1, wherein the bi-directional thermal electric cooler (TEC) is configured to:
dissipate heal away from the first die and towards the second die when (i) the first temperature reading of the first die, is equal or greater than the first maximum temperature for the first die, and (ii) the second temperature reading of the second die, is less than the second maximum temperature for the second die; and
dissipate heat away from the second die and towards the first die when (i) the second temperature reading is equal or greater than the second maximum temperature, and (ii) the first temperature reading is less than the first maximum temperature.

33. The PoP device of claim 14, wherein the bi-directional heat transfer means is configured to:
dissipate heat away from the first die and towards the second package when (i) the first temperature reading of the first die, is equal or greater than the first maximum temperature for the first die, and (ii) the second temperature reading of the second die, is less than the second maximum temperature for the second die; and
dissipate heat away from the second die and towards the first package when (i) the second temperature reading is equal or greater than the second maximum temperature, and (ii) the first temperature reading is less than the first maximum temperature.

34. The method of claim 20,
wherein configuring the bi-directional thermal electric cooler (TEC) to dissipate heal away from the first die comprises configuring the bi-directional thermal electric cooler (TEC) to dissipate heat away from the first die and towards a second package comprising the second die, when (i) the first temperature reading is equal or greater than the first maximum temperature, and (ii) the second temperature reading is less than the second maximum temperature;
wherein configuring the bi-directional thermal electric cooler (TEC) to dissipate heal away from the second die comprises configuring the bi-directional thermal electric cooler (TEC) to dissipate heat away from the second die and towards a first package comprising the first die, when (i) the second temperature reading is equal or greater than the second maximum temperature, and (ii) the first temperature reading is less than the first maximum temperature.

* * * * *